US012008301B2

(12) United States Patent
Spreij

(10) Patent No.: US 12,008,301 B2
(45) Date of Patent: Jun. 11, 2024

(54) MAPPING MULTI-DIMENSIONAL COORDINATES TO A 1D SPACE

(71) Applicant: Imagination Technologies Limited, Kings Langley (GB)

(72) Inventor: Tijmen Spreij, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 17/844,121

(22) Filed: Jun. 20, 2022

(65) Prior Publication Data

US 2023/0026788 A1 Jan. 26, 2023

(30) Foreign Application Priority Data

Jun. 18, 2021 (GB) ..................................... 2108726

(51) Int. Cl.
*G06F 30/392* (2020.01)
*G06T 1/20* (2006.01)
*G06T 1/60* (2006.01)
*G06T 15/04* (2011.01)

(52) U.S. Cl.
CPC .............. *G06F 30/392* (2020.01); *G06T 1/20* (2013.01); *G06T 1/60* (2013.01); *G06T 15/04* (2013.01)

(58) Field of Classification Search
None
See application file for complete search history.

(56) References Cited

U.S. PATENT DOCUMENTS

| 6,614,443 B1 | 9/2003 | Peterson |
| 10,970,809 B1 | 4/2021 | Seiler |
| 2014/0362922 A1* | 12/2014 | Puri ....................... H04N 19/196 375/240.16 |
| 2021/0192677 A1* | 6/2021 | Seiler ....................... G06T 15/04 |
| 2021/0242967 A1* | 8/2021 | Yang ....................... H04L 1/0061 |

FOREIGN PATENT DOCUMENTS

| GB | 2608107 A | * 12/2022 | ........... G06F 30/392 |
| JP | 2015/207203 A | 11/2015 | |
| WO | 2016077020 A1 | 5/2016 | |

OTHER PUBLICATIONS

Internetarchivebot et al "Z-order curve"; URL:https://en.wikipedia.org/w/index.php?title=Z-order_curve&oldid=8221458414; Jan. 2018; pp. 1-7.

* cited by examiner

*Primary Examiner* — Patrick F Valdez
(74) *Attorney, Agent, or Firm* — Potomac Law Group, PLLC; Vincent M DeLuca

(57) ABSTRACT

A circuit for mapping N coordinates to a 1D space receives N input bit-strings representing respective coordinates, which can be of different sizes; produces a grouped bit-string therefrom, in which the bits, including non-data bits, are grouped into groups of bits originating from the same bit position per group; and demultiplexes this into n=1 . . . N demultiplexed bit-strings, and sends each to a respective n-coordinate channel. The nth demultiplexed bit-string includes a respective part of the grouped bit-string that has n coordinate data bits and N-n non-data bits per group, and all other groups filled with null bits. Each but the N-coordinate channel includes bit-packing circuitry which packs down the respective demultiplexed bit-string by removing the no-data bits, and removing the same number of bits per group from the null bit. The packed bit-strings are then aligned relative to one another according to the corresponding bit positions, and combined.

20 Claims, 9 Drawing Sheets v[1]v[0]u[1]u[0]

v[1]u[1]v[0]u[0]

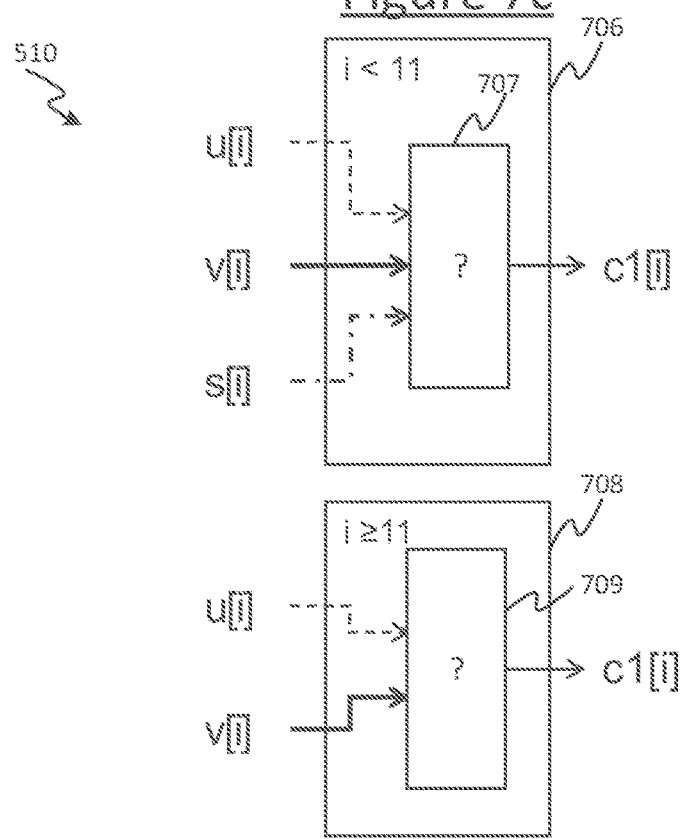
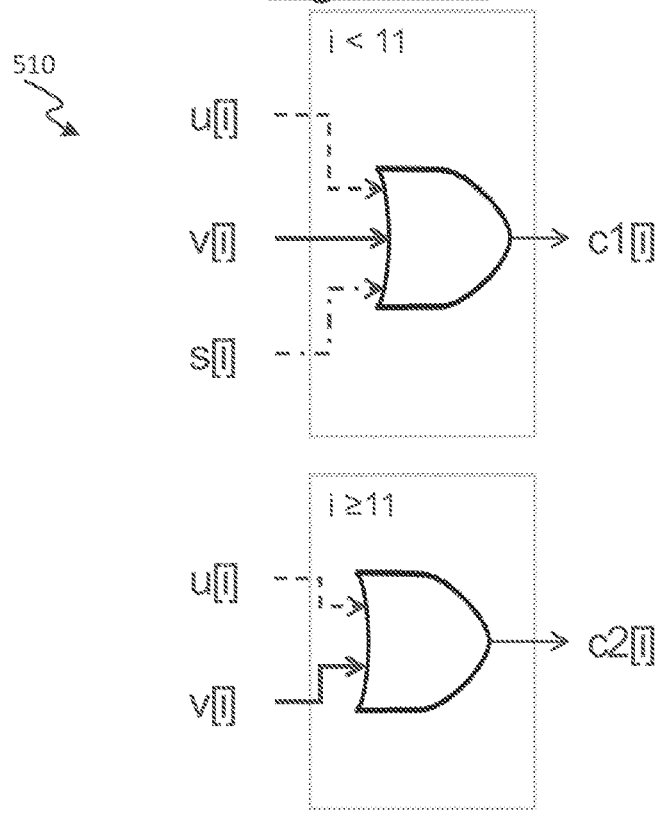

MAPPING MULTI-DIMENSIONAL COORDINATES TO A 1D SPACE

BACKGROUND

A graphics processing unit (GPU) is a type of dedicated processor that includes dedicated hardware for performing various operations of a graphics processing pipeline. In a typical graphics pipeline, an application outputs a 3D model defined in terms of a plurality of facets, e.g. triangular facets. These are sometimes also called "primitives". In successive pipeline stages, these facets may be translated, rotated, and have lighting effects applied. In another successive stage, the facets are projected from 3D space to the 2D space of the screen area, and some facets that fall outside the screen area may be culled. In a further pipeline stage, the 2D projections of the facets are rasterized, meaning to map them to onto a pixel grid. At this stage pieces of the facets corresponding to the points on the pixel grid may be referred to as image fragments. There may be a one-to-one mapping between fragments and pixels in the x-y plane. However some of the fragments of different facets may be behind one another in the z direction. Therefore another pipeline stage will perform a hidden surface removal (also referred to as a z test or depth test), to determine which fragments are behind others in order to cull these. The remaining fragments after the hidden surface removal may then be used to determine the colours of pixels to be lit up on the screen. Other pipeline stages such as texturing and shading may also be performed on fragments or pixels, depending on the order of the pipeline stages. Depending on implementation, the stages in a graphics pipeline can be implemented in different orders.

A texture is an image that defines a pattern. The purpose of a texture is to be projected onto a virtual object which has some shape or contour, in order to apply the pattern to the object. The image of the texture is made up of a grid of texels, each texel corresponding to a different point in the grid. A texel is identified by a set of coordinates specifying the location of the point within the grid, and each location has a corresponding texture value which gives the value of one or more texture properties at that point in the texture. The texture property or properties may comprise for example any one or more of: intensity, one or more colour channels of a colour space (e.g. RGB or YUV), transparency (also called the alpha channel), an elevation or relief, and/or a surface normal. For instance, textures can be used to represent colours but also information other than colours. The transparency (usually referred to as alpha channel) is typically stored per texel alongside colour information in a colour texture, e.g. in an RGBA texture, where every texel will store a red, green, blue and alpha channel. Besides colour and transparency, textures can also be used to represent other information about an object's visible surface, for example in a heightmap where every texel will store a value for the elevation from the surface. This can be useful to create detail at a finer scale than the object's geometry, for example grooves in the bark of a tree that would be complex to model otherwise. Other examples are bump mapping, normal mapping, reflection mapping and parallax mapping, etc. For example the texture value may comprise a surface normal. E.g. consider a geometry that is a simple sphere. For every point on the sphere there is defined a normal vector, i.e. a vector that is perpendicular to the surface. Normal vectors are typically used in lighting techniques, to calculate the intensity of reflected light. A trick used to cheaply create the illusion of fine-grained detail on a surface where in reality the surface is relatively smooth, is to modify the directions of the normal. Such a 'normal map' is also stored in texture format, and then applied to the geometry.

A texture can be a 2D image which is projected onto the surface of the object, or a 3D image which is projected throughout a volume of the object. E.g. the object could be a cloud or translucent mass, or a non-translucent object. An example is a 3D texture that models a volume of marble with veins of different colours running through it. When this is projected onto a solid geometry, for example a statue, the colour on the surface of the statue is determined by where the geometry intersects with the 3D texture. For the purposes of the present description, and by way of arbitrary terminology only, the first two dimensions of a texture may be referred to herein in terms of variables labelled "u" and "v", and the optional third dimension will be referred to herein in terms of a variable labelled "s". The element u[i] refers to the bit of u at index i, i.e. a certain bit position counting from least to most significant, and similarly for v[i] and s[i], where i=0 is the least significant bit position.

The texture may be applied after the projection of the objects onto the 2D image plane, e.g. using a technique called "perspective correct texture mapping". Each facet (primitive) is sampled to generate fragments, and each facet (primitive) may generate multiple fragments. The sampling is performed according to a predetermined sampling pattern which corresponds to the pixel grid of the eventual image. For example, one sample point per pixel generates one fragment (assuming opaque primitives, after hidden surface removal, etc), and therefore one colour, per pixel. Multiple samples per pixel (e.g. 4 or 16) may be used for effects such as antialiasing. The texture may then be sampled for each generated fragment, for example by interpolating texture coordinate values defined at the vertices of the facet (primitive) and using the interpolated coordinates to perform one or more lookups into the texture to determine, for example, a colour for the fragment. In this way the position of the fragments may be mapped onto positions in the texture. The texture coordinate interpolation may be a perspective correct interpolation. If a facet covers is multiple sampling points or pixels, the texture will be sampled for each fragment that is generated, and these samples can all have a different texture value (e.g. colour).

Like any piece of application data, a texture will need to be stored in memory, which involves determining where to store the data in memory (which words of the data are stored to which addresses). In the case of a texture, some scheme is needed to map the 2D or 3D coordinates of each texel onto a respective address at which to store the respective texture value of the texel in the 1D address space of the memory. The naïve way to do this would be in a strided manner whereby the constituent coordinate values of each dimension (u, v and possibly s) are simply concatenated with one another: . . . v[1]v[0]u[1]u[0]. See FIG. 1.

However, when the texture is mapped or projected onto the shape or contour of an object, then a given fragment on the object will almost always map to a point in the texture that falls between the points at which the texel values are defined. If bilinear interpolation is used, this means that the texture value to apply to the fragment will in fact be an interpolation of the value of a square of four adjacent texels. It is also possible to use more complex texture filtering methods that use a block of even more sampling points, like bicubic filtering (16 samples) or anisotropic filtering. A fragment contains all the data needed to render one pixel on screen, so it can be considered as a precursor to the pixel. A fragment might need information (e.g. colour information) about a specific point on the surface of an object. This point on the object will map to a point on a texture, if texture mapping is applied to this object. Usually this point does not map exactly to one of the texel coordinates so some sort of interpolation is required. This means multiple texels need to be read from memory It is therefore better to map texels to memory addresses according to a "twiddled" scheme, i.e. a zig-zag scheme, also called "Morton order" or "Z-order" (Z referring to the shape of the mapping sequence rather the z dimension). This is equivalent to interleaving the bits of the coordinate values in the different dimensions: . . . v[1]u[1]v[0]u[0]. See FIG. 2. Or in 3D that would be: . . . s[1]v[1]u[1]s[0]v[0]u[0]. The output of the twiddling provides an address offset, i.e. the number of texels from the first texel in the texture (it will be 0 if all input coordinates are 0). Afterwards this offset will be multiplied by the memory needed to store 1 texel (this will vary with different texture types), and added to a base address that indicates where the texture can be found in memory The reason is that twiddling is preferable is that the texture values of adjacent texels will be placed close together in memory space. As mentioned, most texture mapping techniques sample more than one texel to determine the colour of a fragment or pixel. For example, the colour value might be calculated as a bilinear interpolation of the four texels closest to the sample point. Further, if scanning systematically in space across the object, then the next fragment on the object is likely to map to a similar position in the texture. Twiddling means that the cost of taking a step in any direction is relatively small and is largely independent of the direction of the step (whereas in a strided mapping, a step in the v direction is more expensive than the u direction). "Cost" here means the power and latency incurred in accessing the required texture values, due to memory page breaks and cache misses. Because texture mapping techniques typically need texels that are relatively close together on the texture, then time and energy are saved when neighbouring texels are also close together in memory.

For complex filtering techniques like bicubic filtering (16 samples) or anisotropic filtering, it becomes even more important that spatial locality in the texture corresponds more-or-less to memory locality. Twiddling can help decrease the number of lines of memory that need to be read to get all of the sample points.

In a dedicated graphics processor or such like, there may be provided dedicated hardware for mapping a texture onto a memory address space. FIG. 3 shows an existing circuit for performing the mapping in a twiddled manner.

In general, the dimensions of a given texture in some particular application could happen to be different in size to one another. This means u, v and/or s may be different numbers of bits in length compared to one another. E.g. in a 2D texture u could be a different size than v; or in a 3D texture u and v could be the same size but s may be a different size, or all of u, v and s could be different sizes. This means that there will be a least significant bit range of each of u, v and s where all three of the coordinates contain data bits; a next most significant range where coordinate data is present in only the two largest coordinates; and a most significant range where only the largest coordinate has data bits. E.g. if u is 8 bits long, v is 12 bits long and s is 10 bits long, then the first range is the least significant 8-bits where all three coordinates have coordinate data, whilst the second range is another 2 bits at the next most significant bit positions where only the two largest coordinates have coordinate data, and the third range is another 2 bits at the most significant bit positions where coordinate data is present in only the largest coordinate.

The circuit of FIG. 3 works by splitting these three different ranges into three separate channels: a 3-coordinate channel 353 which works on only the least-significant bit range where data is present in all three coordinates, a 2-coordinate channel 352 which works on only the middle most significant range where data is present in only the two largest coordinates, and a 1-coordinate channel 351 that works on only the upper (most-significant) range where data is present in only the largest coordinate. The 3-coordinate channel 3-way bit interleaves (312) the bits of the first range, and the 2-coordinate channel 2-way bit interleaves (314) the bits of the second range. The 1-coordinate channel needs no interleaving as there is the data of only one coordinate present here anyway. After interleaving, the different interleaved bit-strings are then shifted to re-align them relative to one another according to the proper bit positions from least to most significant.

SUMMARY

It would be desirable to reduce the complexity of the circuit of FIG. 3 in terms of silicon footprint. Particularly, the inventor has recognized that some of the shifting involved could be reduced. Shifting comes at a particularly high penalty in terms of silicon complexity compared to other operations, because a shifter in hardware requires a multiplexer for every output bit, and this multiplexer can have all bits of the input signal as an input. Because multiplexers are very area intensive (especially wide multiplexers), this amounts to a lot of area. It would be desirable to reduce the amount of shifting needed compared to FIG. 3.

In the circuit of FIG. 3, in order to select only the upper, most significant bit bitrange of the largest coordinate, the 1-coordinate channel has to right shift (306) the original input bit-strings by B where B is the size of the middle-sized coordinate. It then uses a multiplexer 310 to select only the bits of the largest coordinate based on an external control signal that indicates which is the largest coordinate. In order to work on the middle-most significant bit range of the two largest coordinates, the 2-coordinate channel has to right shift (304) the original input bit-strings by A where A is the size of the smallest coordinate. It then uses a multiplexer 308 to select only the bits of two largest coordinates based on an external control signal that indicates which is the smallest coordinate. To re-align the bit-strings produced by the different channels to the proper positions (least to most significant), the 2-coordinate channel then has to left shift its respective bit-string by 3A, and the 1-coordinate channel then has to left-shift its respective bit-string by 3A+2(B−A).

All this shifting is complex. The present disclosure provides an alternative form of circuit which reduces the need for shifting. In embodiments it also reduces the complexity of the multiplexing.

The applicability is not limited to textures or GPUs. Similar considerations could apply to any circuit for mapping coordinates of some multi-dimensional space or grid onto linear memory addresses, e.g. coordinates of a feature space in a dedicated AI accelerator processor.

According to one aspect disclosed herein, there is provided a circuit for use in a processor. The circuit comprises an input arranged to receive a set of N input bit-strings each comprising a respective coordinate of a set of N coordinates defining a point in N dimensions, where N≥2. Each input bit-string comprises at least a first portion wherein the first portions are the same fixed number of bits in size as one another. Within each input bit-string each bit has a corresponding bit position from least to most significant within the bit-string. The circuit is capable of accommodating different size coordinates, whereby in one or more of the input bit-strings the respective coordinate occupies only some of the bit positions with actual coordinate data representing the respective coordinate. The coordinate data is located in the least significant bit positions while any non-data bits not representing the respective coordinate are located in the most significant bit positions.

The circuit comprises grouping circuitry arranged to produce a grouped bit-string from the input bit-strings, in which the bits, including non-data bits, are grouped into groups of bits originating from the same bit position per group. The grouping circuitry may also be described as interleaving circuitry, arranged to bit-interleave the input bit-strings, including non-data bits, to produce an interleaved bit-string (grouped bit-string) in which the bits are grouped into groups of bits originating from the same bit position per group, the interleaving comprising N-way interleaving the first portions. However this does not necessarily limit to any particular hardware implementation nor to an implementation that involves shift registers or logic gates or the like, and in embodiments the interleaving or grouping may be implemented simply by a re-routing of the wires carrying the different data bits.

The circuit further comprises a demultiplexer operable to demultiplex the grouped bit-string into n=1 . . . N demultiplexed bit-strings, and send each to a respective n-coordinate channel. The nth demultiplexed bit-string comprises: a respective part of the grouped bit-string in which there are n coordinate data bits and N-n non-data bits per group, and all the other groups filled with null bits, unshifted relative to the respective part. Each but the N-coordinate channel comprises bit packing circuitry arranged to pack down the respective demultiplexed bit-string into a respective packed bit-string by removing the no-data bits from said respective part, and removing the same number of bits per group from the null bits. The circuit further comprises shift-and-combine circuitry, arranged to shift the packed bit-strings to align them relative to one another according to the corresponding bit positions, and to combine the shifted bit-strings, thereby producing a combined output bit-string.

In embodiments N may be equal to 2, 3, or even 4 or greater.

The disclosed circuit thus interleaves all the coordinates together at the start, before de-multiplexing them into separate channels. It then de-multiplexes the interleaved bit-string into N (e.g. three) bit strings padded with null-bits, even though only part of it contains the respective coordinate data of that channel. E.g. in a 3D example, the 2-coordinate channel is provided to handle the middle-most significant bit range where actual coordinate data exists for only two out of three of the coordinates. However, the demultiplexed signal in the 2-coordinate channel is also padded with null-bits in the less and more significant bit ranges above and below the middle-most significant bit range. And the 1-coordinate channel is provided to handle the most-significant bit-range where actual coordinate data exists for only the largest coordinate, but it is nonetheless padded with null bits in the full range below that.

This is shown by way of example in FIGS. 5 to 6b, to be discussed in more detail later. Each channel (other than the N-coordinate channel, e.g. the 3-coord channel in the 3D example) then packs down the bits of its respective bit-string by a corresponding amount. E.g. so in the 3D example, the 2-coordinate channel removes one in three bits, including the no-data bits that correspond to the empty bit positions of the smallest coordinate in the middle bit-range, and also including removing one in three of the null bits in the bit ranges above and below. And in the 1-coordinate channel, the packing removes the no-data bits corresponding to the empty bit positions of the smallest and next-smallest coordinates in the upper (most significant) bit range, as well as removing two out of three of the null bits in the ranges below that.

The idea of interleaving all the coordinate bits together, including no-data bits, and then creating strings padded with null bits in each channel, may seem counter-intuitive if thinking about reducing complexity. However, it turns out that by doing this, then after the packing, only a relatively simple amount of shifting is required to align the outputs of the different channels. No right shifting is needed at all, and only a relatively simple amount of left shifting is needed.

For instance, in embodiments the shift-and-combine circuitry may comprise cascaded shift-and-combine circuitry, whereby: the packed bit-string output by the 1-coordinate channel provides a first respective partial output bit-string; and for each of the other n-coordinate channels from n=2 . . . N the shift-and-combine circuitry comprises a respective nth cascade stage, each but the Nth providing a further respective partial output bit-string and the Nth providing the combined output bit-string. In this case each nth cascade stage comprises a respective left-shifter arranged to left shift the partial output bit-string of the (n−1)-coordinate channel by the bit width of the nth largest coordinate to produce a shifted packed bit-string aligned relative to the unshifted packed bit-string from the n-coordinate channel, and respective combining circuitry arranged to combine the shifted packed bit-string from the respective left-shifter with the unshifted packed bit-string from the n-coordinate channel, thereby providing the respective partial output bit-string for each of n=2 . . . (N−1) or the combined output bit-string for n=N, respectively.

E.g. in the 3D example, and only two left shifts are needed: one by a simple amount of A and the other by a simple B bits (as opposed to 3A and 2(B−A) in the prior circuit of FIG. 3).

In embodiments, the null-bits are 0, and the combining in the shift-and-combine circuitry is by bitwise OR. Alternatively the null bits are 1, and the combining in the shift-and-combine circuitry is by bitwise AND.

In embodiments, the circuit may optionally comprise masking circuitry arranged to mask each of the no-data bits to a mask value prior to input to the grouping circuitry.

In some embodiments, M of the input bit-strings may each further comprise a second portion comprising one or more bits at more significant bit positions than the first portion, where 1≤M<N and if M>1 the second portions are the same fixed size as one another, such that the coordinates of the M input bit-strings have a larger maximum size being the size of the first portion plus the second portion, and the coordinates of the other N−M bit-strings have a smaller maximum size being the size of the first portion only. In the case where M>1, the grouping of the bits from the second portions may be described as M-way interleaving the second portions (though again the reference to "interleaving" does not limit to any particular physical implementation).

In one example implementation, the size of each first portion may be 11 bits and the size of each second portion may be 4 bits, such that the M coordinates have a maximum size of 15 bits and the N−M coordinates have a maximum size of 11 bits.

In an example implementation N=3 and M=2.

The inventor has also recognized that, by preparing the de-multiplexed, unpacked bit-strings in each channel (including the null bits) then the information in these bitstreams enables a reduction in the amount of additional signals needed to select between the bits of the different coordinates in the packing.

Hence in embodiments wherein each of the packing circuitry is configured to select, in the respective demultiplexed bit-string, at least in said respective part, between the bits of each group based on the values of the bits in the group.

For instance, in the 3D case where N=2 and M=3, then in the one-coordinate channel, the inventor has recognized that all the information needed to make the selection is already present in the demultiplexed bit-strings themselves. In the two-coordinate channel, only a single additional signal is needed, which indicates whether or not a particular one of the coordinates is the smallest (the particular coordinate being s or v in the later-described embodiments). Compare with FIG. 3 where each of the multiplexers 308, 310 needs a 2-bit external signal (one to indicate which of the coordinates is the largest, and one to indicate which coordinate is the smallest.

Hence in embodiments, the bit packer in the 2-coordinate channel may comprise circuitry configured to provide a first path and a second path as follows. The first path may be arranged to pack down the bits that originate from the first portions of all three input bit-strings, the first path being arranged to select bit-by-bit between the two coordinates with the larger maximum size, and to select bit-by-bit between one of the coordinates with the larger maximum size and the coordinate with the smaller maximum size, the selections in the first path being based only on the values of the bits in the respective demultiplexed bit-string, and on an indication of whether or not an indicative one of the coordinates has the smallest size out of said set of coordinates, wherein the indicative coordinate is the coordinate whose bit is placed at the least or most significant bit position in each group in the grouped bit-stream. The second path may be arranged to pass through the bits that originate from the second portions of the two input bit-strings with the larger maximum size.

In embodiments, the bit packer in the 1-coordinate channel may comprise circuitry configured to provide a third path and a fourth path as follows. The third path may be arranged to pack down the bits that originate from the first portions of all three input bit-strings, the third path being arranged to select bit-by-bit between all three coordinates. The fourth path may be arranged to pack down the bits that originate from the second portions of the two input bit-strings with the larger maximum size, the fourth path being arranged to select bit-by-bit between the two coordinates with the larger maximum size. The selection in both the third and fourth paths may be based only on the values of the bits in the respective demultiplexed bit-string.

According to another aspect of the present disclosure there is provided a processor comprising the disclosed circuit. In embodiments, the processor may be programmed to use the set of coordinates to represent a location of a texel within a texture, and to apply the texture to a virtual object in a graphics processing pipeline, said value comprising one or more of: a colour of the texel, a transparency of the texel, a surface elevation of the texel, and/or a surface normal.

The circuit or processor may be embodied in hardware on an integrated circuit. There may be provided a method of manufacturing the circuit or processor at an integrated circuit manufacturing system. There may be provided an integrated circuit definition dataset that, when processed in an integrated circuit manufacturing system, configures the system to manufacture the disclosed circuit or processor. There may be provided a non-transitory computer readable storage medium having stored thereon a computer readable description of a circuit or processor that, when processed in an integrated circuit manufacturing system, causes the integrated circuit manufacturing system to manufacture an integrated circuit embodying the disclosed circuit or processor.

There may be provided an integrated circuit manufacturing system comprising: a non-transitory computer readable storage medium having stored thereon a computer readable description of the disclosed circuit or processor; a layout processing system configured to process the computer readable description so as to generate a circuit layout description of an integrated circuit embodying the disclosed circuit or processor; and an integrated circuit generation system configured to manufacture a circuit or processor according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

According to another aspect there is provided a method comprising: receiving a set of N input bit-strings each comprising a respective coordinate of a set of N coordinates defining a point in N dimensions, where N≥2, each input bit-string comprising at least a first portion wherein the first portions are the same fixed number of bits in size as one another, wherein within each input bit-string each bit has a corresponding bit position from least to most significant within the bit-string, and wherein the circuit is capable of accommodating different size coordinates whereby in one or more of the input bit-strings the respective coordinate occupies only some of the bit positions with actual coordinate data representing the respective coordinate, the coordinate data being located in the least significant bit positions while any non-data bits not representing the respective coordinate are located in the most significant bit positions; producing a grouped bit-string from the input bit-strings, in which the bits, including non-data bits, are grouped into groups of bits originating from the same bit position per group; and demultiplexing the grouped bit-string into n=1 . . . N demultiplexed bit-strings and send each to a respective n-coordinate channel, the nth demultiplexed bit-string comprising: a respective part of the grouped bit-string in which there are n coordinate data bits and N-n non-data bits per group, and all the other groups filled with null bits, unshifted relative to the respective part; wherein each but the N-coordinate channel packs down the respective demultiplexed bit-string into a respective packed bit-string by removing the no-data bits from said respective part, and removing the same number of bits per group from the null bits; and wherein the method further comprises shifting the packed bit-strings to align them relative to one another according to the corresponding bit positions, and combining the shifted bit-strings, thereby producing a combined output bit-string.

Any of the above features may be combined as appropriate, as would be apparent to a skilled person, and may be combined with any of the aspects of the examples described herein.

This Summary is provided merely to illustrate some of the concepts disclosed herein and possible implementations thereof. Not everything recited in the Summary section is necessarily intended to be limiting on the scope of the disclosure. Rather, the scope of the present disclosure is limited only by the claims.

BRIEF DESCRIPTION OF THE DRAWINGS

Examples will now be described in detail with reference to the accompanying drawings in which:

FIGS. 7a-7d are schematic diagrams showing some example circuits implementing bit packing circuitry for use in the circuit of FIG. 5.

Figure 1:
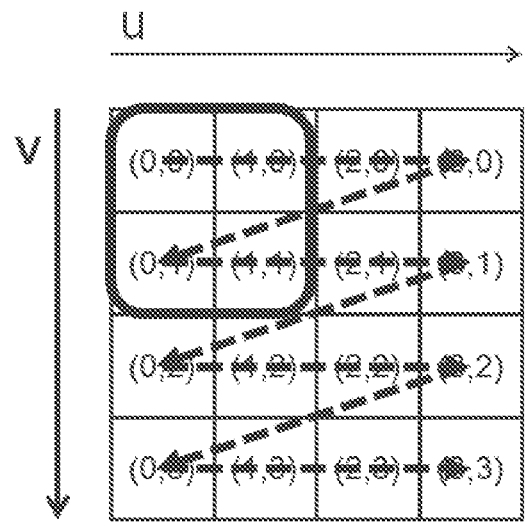
FIG. 1 is a schematic illustration of a strided scheme for mapping sets of coordinates to memory addresses, FIG. 2 schematically illustrates a twiddled scheme for mapping sets of coordinates to memory addresses.
Figure 2:
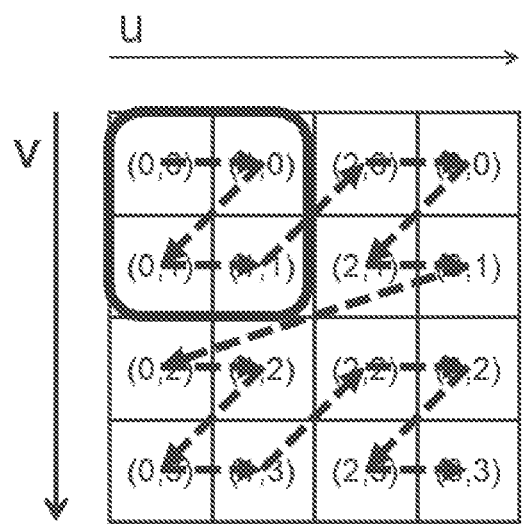

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments will now be described by way of example only.

In a processor such as a GPU, coordinate values of texels are represented in binary. The coordinates need to be mapped to respective memory address in which to store the associated texture values such as colour, alpha channel, elevation and/or surface normal (also in binary). As discussed previously, the address offset for a texel in a twiddled 2D or 3D texture can be calculated by interleaving texel coordinate bits, starting at the LSBs of the coordinates. Because these texture dimensions may have different sizes, texel coordinates are represented by bit arrays of varying widths. This means that the calculated address offset first has a section with all three coordinates interleaved, followed by a middle section with bits from only two coordinates interleaved, and finally a top section with the remaining bits of the largest dimension's coordinates. Any of these sections can have 0 width, depending on the coordinate sizes. Different sections of the coordinates will need to be interleaved and aligned in a different way depending on the coordinate widths.

Similar considerations may apply to storing any multidimensional array of data to memory, whether the data is of two, three or more dimensions. For instance, a time-varying 3D texture could be described as having four dimensions (the fourth being time, i.e. each step in the 4th dimension representing a different 3D "frame" of the volume of the texture at a different moment in time). Or the array could represent an image other than a texture, such as an image that is to be processed for the purpose of compression or such like. As another example, the array could be a multi-dimensional feature space in an AI application such as a neural network being implemented in a dedicated AI accelerator processor. The feature space in such an application could comprise image data and/or other data.

In any such application, it could be desirable that the mapping of coordinates in the grid, array or space to memory addresses is twiddled, so that the memory access penalty of taking a step in any direction in the array is small. E.g. this could be applicable in any application where it is desirable to have random access to the memory, or to take systematic steps through the data. For instance, in the field of image processing more generally, consider the storage of an image that needs to be read in small blocks, e.g. 16×16 pixels, for the purpose of compression or the like. Or in the field of AI, it is often required to convolve a small kernel across a multi-dimensional feature space in neural network, such as might be implemented in an AI accelerator processor or the like. By way of example, the following will be described in terms of the application to a texture in a graphics processing pipeline, but it will be appreciated that this is not limiting. Any reference to a texture in the description herein could be replaced more generally with reference to any grid or array of values or any multidimensional space, of any dimensionality from 2D upwards.

The location of each point in a texture is defined by a set of coordinates, e.g. u, v and s. Texture size determines coordinate bit widths. A processor, including the circuit for mapping coordinates to memory addresses, may support up to a maximum size of texture in each dimension, and the maximum size could be the same or different for the different coordinates, depending on implementation. In the examples below the circuit 300/500 supports a maximum size of 15 bits for u and v, and 11 bits for s. This gives a maximum texture size of 32k*32k*2k texels (or to be precise, 2^15*2^15*2^11=32768*32768*2048).

For some particular texture in a given use case, the actual size of the coordinate in any given dimension may happen to be smaller than the maximum supported size. Also, the coordinates may happen to have different sizes compared to one another. The address bit width is equal to the sum of coordinate bit widths. The address bits are packed towards the least significant bit (LSB) side. For instance consider an example in which u is 12 bits long, v is 10 bits long and s is 7 bits long. This gives a texture sizes of 16k*4k*128 texels, and an address offset value that is 14+12+7=33 bits in length, packed as follows:

u[11]u[10] v[9]u[9]v[8]u[8]v[7]u[7]s[6]v[6]u[6]s[5]v[5]u[5] s[1]v[1]u[1]s[0]v[0]u[0]

This can be considered as made up of three portions:

A most significant, 1-coordinate portion: u[11]u[10] where only u has coordinate data bits;

A middle-most significant, 2-coordindate portion: v[9]u[9]v[8]u[8]v[7]u[7] where only u and v have coordinate data bits; and A least significant, 3-coordinate portion: s[6]v[6]u[6] s[0]v[0]u[0] where all three of u, v and s have coordinate data.

Figure 3:
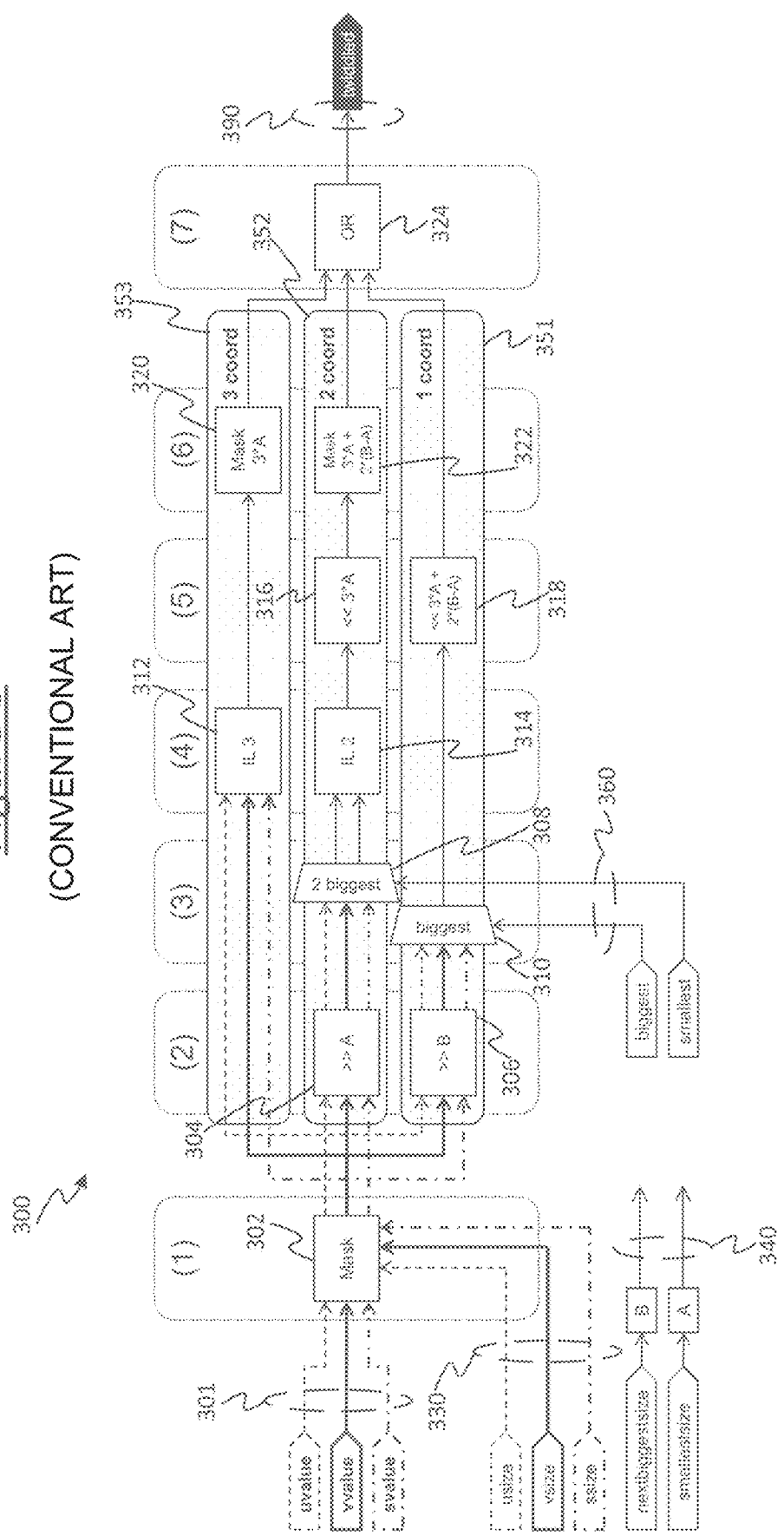
FIG. 3 is a schematic block diagram of a previous implementation of a circuit for mapping sets of coordinates to memory addresses.
Figure 4:
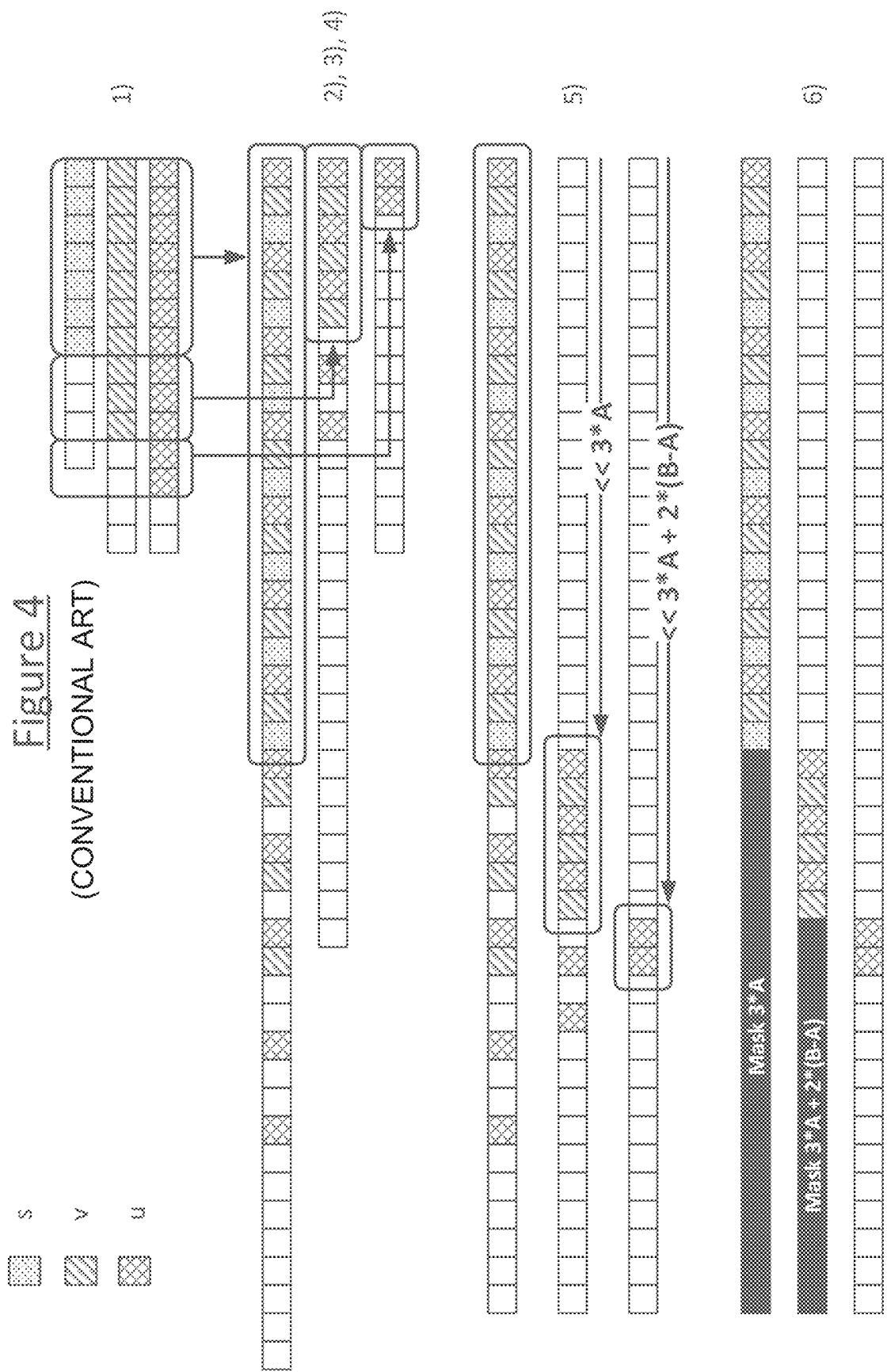
FIG. 4 is a schematic illustration of the operation of the circuit of FIG. 3 in an example scenario.

By way of comparison with the presently disclosed circuit, FIG. 3 shows the previously known circuit 300 for mapping texture coordinates to memory addresses in a graphics processing pipeline of a GPU. FIG. 4 illustrates the operation of the circuit of FIG. 3 in an example use case where u is 12 bits long, v is 10 bits long and s is 7 bits long.

In the circuit 300 of FIG. 3 the maximum size of {u,v,s} is {15,15,11} as in the above example. The circuit 300 comprises: a coordinate data input 301, a first control input 330, a second control input 340, a third control input 360, an input mask 302, a 3-coordinate channel 353, a 2-coordinate channel 352, a 1-coordinate channel 351, a 3-way OR unit 324, and an output 390. The OR unit 324 may be implemented using a set of OR-gates to perform a bitwise OR. The 3-coordinate channel 353 comprises: a 3-way interleaver (IL3) 312 and a first output mask 320. The 2-coordinate channel comprises: a first right-shifter 304, a first multiplexer 308, a 2-way interleaver (IL2) 314, a first left-shifter 316 and a second output mask 322. The 1-coodinate channel 351 comprises a second right-shifter 306, a second multiplexer 310, and a second left-shifter 318. Each of these components is implemented in fixed-function hardware, i.e. dedicated hardware circuitry.

These components are arranged into seven stages, (1)-(7). Stage (1) comprises the input mask 302. Stage (2) comprises the first and second right-shifters 304, 306. Stage (3) comprises the first and second multiplexers 308, 310. Stage (4) comprises the interleavers 312, 314. Stage (5) comprises the left-shifters 316, 318. Stage (6) comprises the output masks 320, 322. Stage (7) comprises the OR unit 324. The operation of these components in each stage 1-6 is also shown in the example of FIG. 4.

The coordinate input 301 takes the form of a set of parallel wires for receiving the coordinates, one wire for each bit of each coordinate. This is the input for receiving the actual coordinate data, i.e. the actual coordinate value {uvalue, vvalue, svalue} of each respective coordinate {u, v, s}. In other words uvalue=u[usize-1] . . . u[0], vvalue=v[vsize-1] . . . v[0], svalue=s[ssize-1] . . . s[0] (from MSB to LSB); where {usize, vsize, ssize} are the sizes in bits of the coordinates {u,v,s} respectively. Similar notation will also be adopted later with respect to FIG. 5.

The coordinate data originates from the processor in which the circuit 300 is implemented, and may be generated, either by a software process running on that processor, or by other hardware in the processor, in response to a need to read or write texel values from or to a twiddled format texture in memory. For example, the twiddling circuit may be used when texture coordinates are generated by a texture mapping process used to read and assign texture values to fragments during the rendering of an image. In an alternative example the twiddling circuit may be used when an application running on the GPU writes a twiddled format texture to memory, such as when converting textures from strided formats to twiddled formats. The sequence of texture coordinates generated, whether reading or writing texture data, may address a whole texture or part of a texture, and may access the texels of that texture in any order, e.g. in order, or in a random access pattern.

The first control input 330 receives a signal indicating the size of each coordinate, e.g. usize=12, vsize=10, ssize=7 as in the earlier example. This input 330 is also implemented as a set of parallel wires, one control bit per wire, with enough wires to indicate the maximum size of each coordinate u, s, v in binary. The second control input 340 receives two control signals: the smallest coordinate's size A (one of usize, vsize and ssize), and the next largest coordinate's size (another of usize, vsize and ssize). Again this input is implemented as parallel wires with enough wires to accommodate the maximum number of bits that might be required to communicate this information in binary. The third control input 360 receives another two control signals: "biggest" which indicates which of the coordinates u, v and s has the largest size; and "smallest" which indicates which of the coordinates u, v and s has the smallest size. Each of these two signals is communicated in binary on a respective pair of wires (two control bits are required to indicate a selection from among three possibilities). The control signals on second and third control inputs 340, 360 are calculated automatically by dedicated hardware based on the texture supplied by the software. The control signal on the first control input 330 is just a property of the texture and may be passed directly from the software without any need for calculation.

In stage (1), for each dimension, the mask 302 masks the unused most-significant bits (MSB) of the respective coordinate. The masking is done based on the coordinate size values usize, vsize, ssize as input on the first control input 330. Masking here means setting the masked bits to 0. The bits that are 'masked' in this stage are any bits of the coordinate inputs (uvalue, vvalue, svalue) that have an index larger than the size of their respective coordinate inputs, as indicated by usize, vsize and ssize. This may not be needed, as if for example usize is 2, then any bits of uvalue other than the two LSBs should be set to 0. However, if one or more of the coordinates have size 0 (e.g. for a 1D or 2D texture), then the value input for these coordinates may not necessarily be set to 0 if, for example, the coordinates are stored in a set of registers that drive the input wires of the twiddle component, and these registers are not reset after a previous texture with a higher dimensionality (e.g. a 3D). Then if the circuit first handles the coordinates of a 3D texture that use the twiddle component (e.g. uvalue=5, vvalue=6 and svalue=3), followed by a 2D texture that does not use coordinate s, then the svalue input may still have the value of 3 during the 2D texel address calculation. The masking module then basically sets the coordinate of s to 0.

However in some implementations the mask stage (1) can be omitted, for example if the hardware supplying the coordinate inputs can guarantee that the coordinate values are already in the expected range, and that unused MSBs of each coordinate value are already set to zero.

Following the masking (if used), the constituent coordinates are then fed to each of the three channels 351, 352, 353. The 3-coordinate channel 353 is provided in order to deal with the LSB portion of the coordinate values that is present in all three dimensions, the 2-coordinate channel is provided in order to deal with the middle-most significant portion present in only the two-largest dimensions, and the 1-coordinate channel is provided in order to deal with any MSBs present for only the largest size dimension.

Each channel 351, 352, 353 initially receives all the bits of all three coordinates from the input 301. At stage (2), in the 2- and 1-coordinate channels 352, 351, each of the coordinate values is then right shifted to remove the LSB dealt with by the lower order channel(s). The size of these shifts is given by A and B respectively (the size of the smallest and next largest coordinate sizes) as indicated via the second control input 340. I.e. in the 1-coordinate channel 351, the respective right-shifter 306 rights shifts by B to remove all but the MSB where coordinate data bits are present in only the largest coordinate. And in the 2-coordinate channel 352, the respective right-shifter 304 right shifts by A to remove the LSB portion where coordinate data bits are present in all three coordinates. It will be appreciated that the terms "left" and "right" as used anywhere herein in the sense of a bit position or bit shift refer to the less significant and more significant directions in a bit string, respectively (i.e. left and right as the bits would conventionally be written on a page), not to a physical orientation in the circuit.

At stage (3), in the 2-coordinate channel 352 the respective multiplexer 308 selects the two coordinates with the two largest sizes, and in the 1-coordinate channel 351 the respective multiplexer 310 selects only the coordinate with the largest size. These sections are based on the "smallest" and "biggest" control inputs, respectively, as input via the third control input 360. Both are 2-bit signals that select either the u, v or s dimension as smallest/biggest.

At stage (4), in each of the 3- and 2-coordinate channels 353, 352, the remaining bits of the different coordinates handled by that channel are bit interleaved with one another, i.e. interleaved on a bit-by-bit basis. In the 3-coordinate channel 353 the respective interleaver 312 three-way bit interleaves the bits from the LSB portion that are present in all three coordinates u, v, s. In the 2-coordinate channel 353, the respective interleaver 314 two-way bit interleaves the from the middle-most significant bit range where only the two largest coordinates have actual coordinate data.

At stage (5) the interleaved values are left shifted back again to align them to their correct bit-positions in the output word. In the design of FIG. 3, this means that in the 2-coordinate channel 352, the respective left-shifter 316 left-shifts its bits by 3A bits, and in the 1-coordinate channel 351, the respective left-shifter 318 left shifts its respective bits by 3A+2(B−A) bits. At stage (6) there is another masking stage 320, 322 to zero any stray 1s in the MSB of the 3- and 2-coordinate channels 353, 352 respectively (otherwise they would interfere with the OR at the next stage). At stage (7) the aligned, masked values are combined in a bitwise OR 324 to give the address offset at the output 390.

The value output on this output 390 is supplied onwards to a memory access stage of the processor (not shown) where it is used to calculate the corresponding memory address for the texture value associated with the point in the texture defined by the set of coordinates that were input at the coordinate input 301. This may be done by multiplying the offset by the number of memory addresses needed to store one texel's texture value (the number of addressable bytes or words needed per texel's texture value), and adding to a base address. The memory access stage is also implemented in dedicated hardware.

The process described in relation to FIGS. 3 and 4 may be repeated for for one or more further sets of coordinates in the texture, in order to map a part or the whole of the texture to memory. If the GPU is systematically accessing an entire texture, then the process will be repeated for each set of coordinates in the texture. However, often the access is more random, and the GPU will be accessing a texel or groups of texels when required to render a pixel.

However, an issue with the design of FIG. 3 is that the large amount of right and left shifting incurs a high complexity in silicon.

In this previous design, texel coordinates (u: 15 bits, v: 15 bits, s: 11 bits) are duplicated into three separate 'channels', one for each of the sections of the output address: 1 coordinate, 2 coordinates interleaved, and 3 coordinates interleaved. For the 1- and 2-coordinate channels, all texel coordinates are right shifted to align the section of bits required in the respective channels to the LSB.

After this, the coordinates required in each section are selected: the coordinate of the dimension with the largest size in the 1-coordinate channel, and the coordinates of the two largest dimensions for the 2-coordinate channel. For the 3-coordinate section, all coordinates are required, therefore no multiplexing is required. Next, the chosen coordinates in the 2-coordinate channel are interleaved. The same happens with the coordinates in the 3-coordinate channel.

Now the section in the 1-coordinate channel and the interleaved coordinates of the 2-coordinate channel are left shifted, to align them to their required positions in the output address. The 3-coordinate signal is already correctly aligned. Because the 2-coordinate and 3-coordinate channels may have bits which are not required, these are masked before the signals in all channels are combined with a bitwise OR. This gives the desired output.

Several inefficiencies with this approach can be identified, as follows.

Coordinate signals are right shifted, only to be left shifted at a later point.

The right shift operation in the 1- and 2-coordinate channels only happens to eliminate the bits on the LSB side that are not required in the channel. This can be done more efficiently by masking.

Half of the coordinates that are right shifted, are never used: the multiplexer does not select them.

The left shift to align the 1- and 2-coordinate signals must allow for a large number of possible shift widths (1 to 40 bits), which leads to large shifters.

It would be desirable to mitigate some or all of these inefficiencies in an improved design which necessitates less shifting. Particularly, it should at least be possible to eliminate the need for right shifting.

Figure 5:
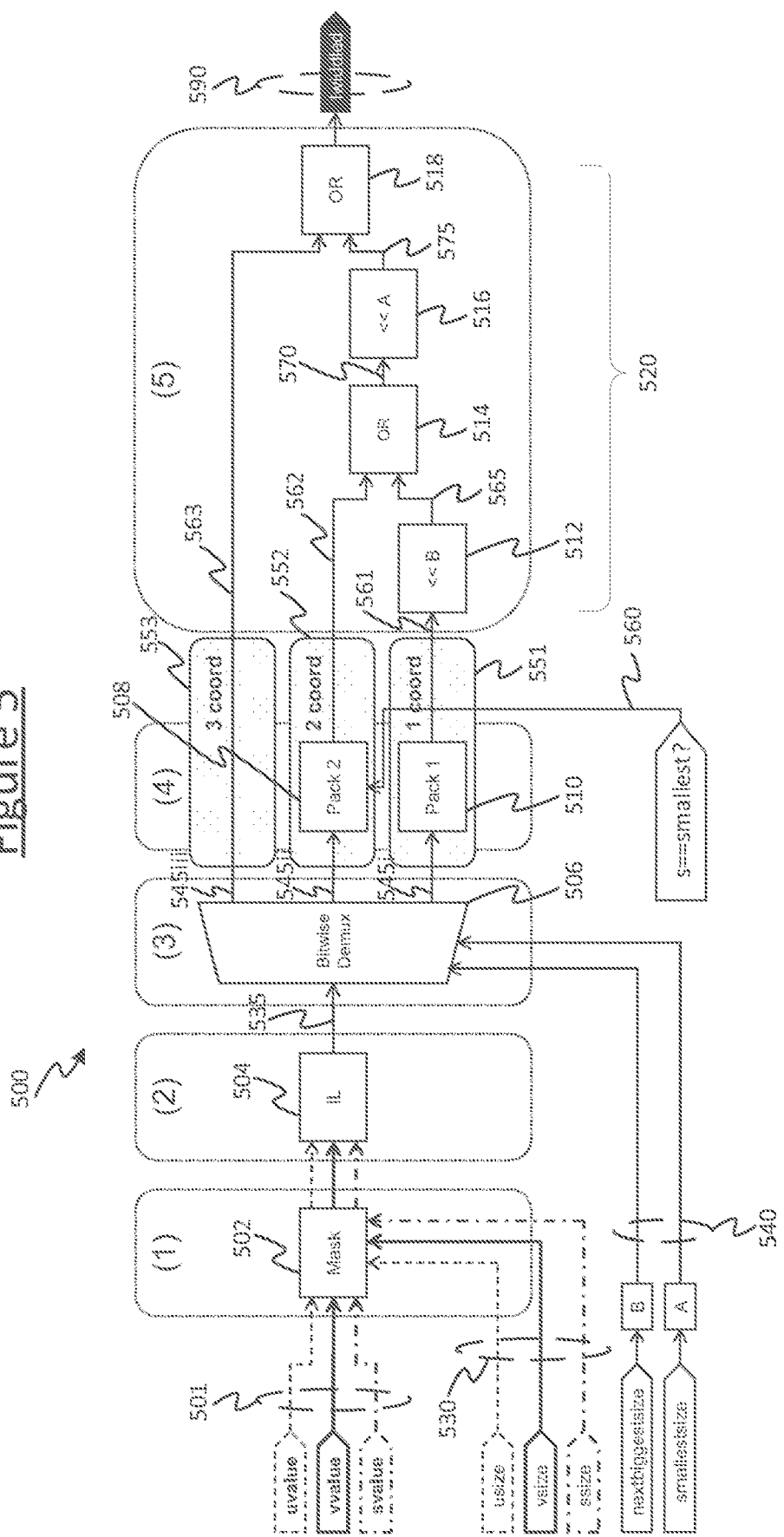
FIG. 5 is a schematic block diagram of a circuit for mapping sets of coordinates to memory addresses in accordance with embodiments disclosed herein, FIGS. 6a-6b give a schematic illustration of the operation of the circuit of FIG. 5 in an example scenario.
Figure 6A:
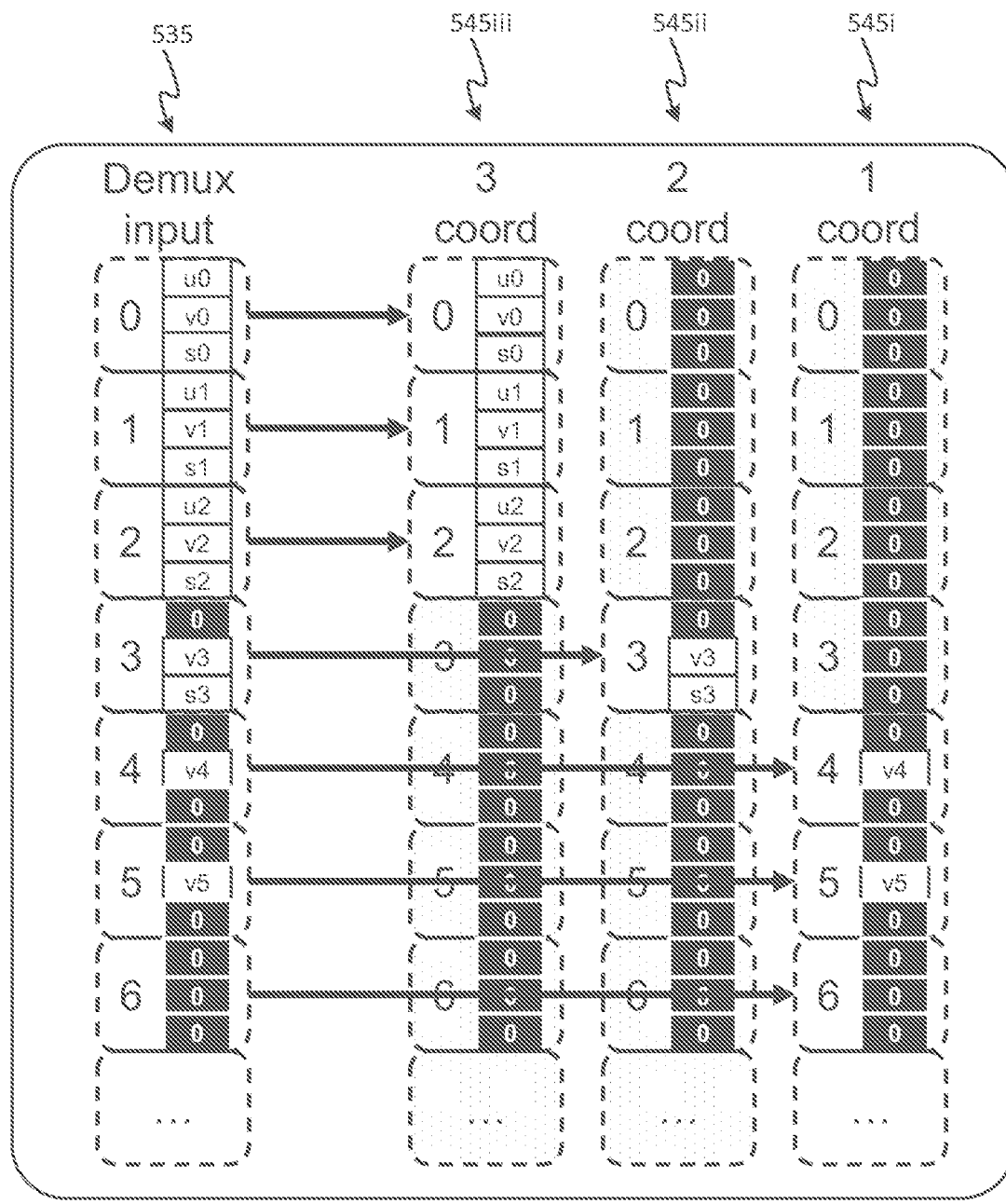
Figure 6B:
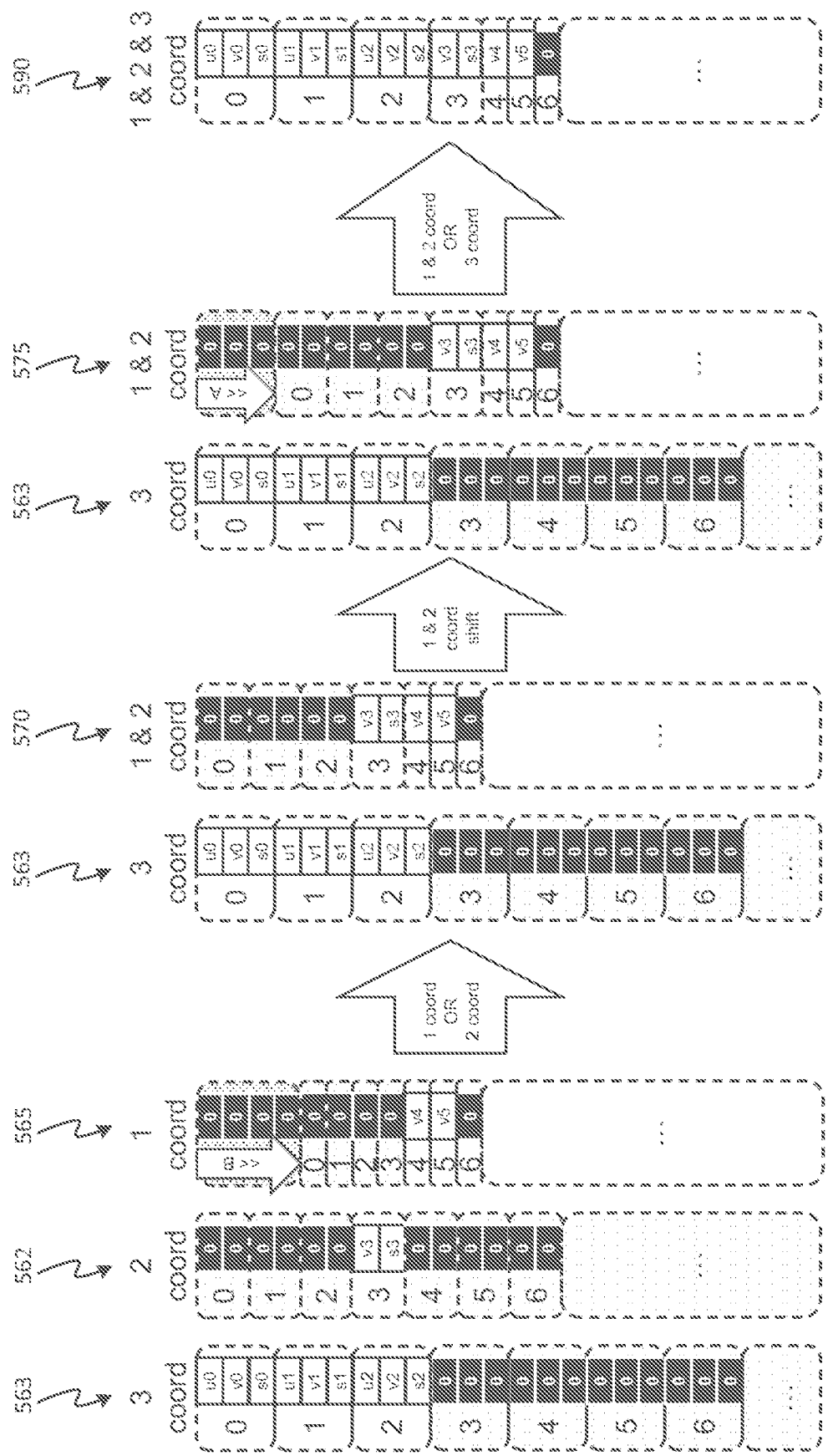

FIG. 5 shows an example of an improved circuit 500 embodying, by way of example, the principles disclosed herein. It performs the same mapping of coordinates to addresses as in FIG. 3, but with reduced complexity, including reduced shifting. FIGS. 6a-6b show the operation of the circuit of FIG. 5 in an example use case where usize=3, vsize=6 and ssize=4.

The example circuit 500 of FIG. 5 accommodates a maximum size of 15 bits for u and v, and a maximum size of 11 bits for s. However it will be appreciated that this is just one example implementation. In some embodiments the maximum size may be the same for u and v, which may correspond to an image plane, but may be different (e.g. smaller) for the third dimension s, which may correspond to a depth of the texture. These two levels of maximum size could take values other than 15 and 11 bits (e.g. 16 bits for u and v, and 13 bits for s, etc.). Or in other embodiments, the maximum size could be the same for all of u, v and s; or there could be three different levels of maximum size for the three different coordinates.

The circuit 500 comprises: a coordinate data input 501, a first control input 530, a second control input 540, a third control input 560, a mask 502, an interleaver 504, a bitwise demultiplexer 506, a 1-coordinate channel 551, a 2-coordinate channel 552, a 3-coordinate channel 553, shift-and-combine circuitry 520, and an output 590. The 2-coordinate channel 552 comprises first packing circuitry (pack 2) 508, and the 1-coordinate channel 551 comprises second packing circuitry (pack 1) 510. Each of these components is implemented in fixed-function hardware, i.e. dedicated hardware circuitry.

These components are arranged into five stages: (1) to (5). Stage (1) comprises the mask 502. Stage (2) comprises the interleaver 504. Stage (3) comprises the demultiplexer 506. Stage (4) comprises the packing circuitry 508, 510 of the 2- and 1-coordinate channels 552, 551 respectively. Stage (5) comprises the shift-and-combine circuitry 520.

The coordinate input 501 is the input for receiving the actual coordinate data, i.e. the actual coordinate value {uvalue, vvalue, svalue} of each respective coordinate {u, v, s}. This data originates from the processor in which the circuit 500 is implemented, for example when it is performing texture mapping operations, as described above in relation to inputs 301.

Preferably the coordinate input 501 takes the form of a set of parallel wires for receiving the coordinates, one wire for each bit of each coordinate. I.e. the coordinates are not input as a serial sequence of bits shifted through a buffer or shift register in series. They could be implemented in that way, but it would add a great deal of delay. Similarly between each pair of components (between mask 502 and interleaver 504, between interleaver and demultiplexer 506, between demultiplexer 506 and each channel 551, 552, 553, etc.) the respective connection is preferably implemented as a group of parallel wires, one for each bit of the signal at that point in the circuit. In embodiments, the implementation does not involve any registers or latches along any path between input 501 and output 590, and is instead implemented using only wires and gates (the shifters are basically a collection of multiplexers and are combinatorial logic, not sequential logic). An alternative implementation that does involve some registers and/or latches (flip-flops) is not excluded, but this would add delay.

The input coordinate data of each coordinate (uvalue, vvalue, svalue) may be referred to as a respective bit-string. As used herein this term does not imply anything beyond a signal comprising a plurality of bits having an order from least to most significance, and could equally be referred to as a bit array, or simply a digital signal. The same may be said of each subsequent signal in stages (1)-(5) through to the output 590.

The mask 502 is arranged to receive the input coordinate data from the input 501 of the circuit 500. The mask 502 masks certain bits and outputs the masked version of each coordinate to the interleaver 504. The interleaver 504 is arranged to interleave the masked coordinates and passes the interleaved output 535 to the demultiplexer 506. The demultiplexer 506 is arranged to demultiplex the interleaved signal 535 from the interleaver 504 into a different respective demultiplexed version 545i, 545ii, 545iii per channel 551, 552, 553. In the 3-coordinate channel 553, the channel is arranged to simply pass on the respective demultiplexed signal 545iii unmodified, as an output 563 to the shift-and-combine circuitry 520. In the 2-coordinate channel 552 the respective packing circuitry 508 is arranged to pack down the respective demultiplexed signal 545ii to remove one in every three bits (or at least, in embodiments where s has a smaller maximum size than u and v, this only applies to the lower part of the interleaved bit-string with index up to and including the maximum index of s; whereas in the upper part, where only u and v can ever have bits, this channel simply consists of wires carrying this uv interleaved part of the bitstring to the combination circuitry). In the 1-coordinate channel the respective packing circuitry is arranged to pack down the respective demultiplexed signal 545i to remove two in every three bits (or one in every two bits in the upper part of the interleaved bit-string where the groups have an index greater than the maximum allowed index of s). The resulting packed signals 562, 561 from the packing circuitry 508, 510 in the 2- and 1-coordinate channels 552, 551, respectively, are passed to the shift- and combine circuitry 520. The shift-and-combine circuitry 520 is arranged to align the signals 561, 562, 563 it receives from the outputs of the 1-, 2- and 3-coordinate channels 551, 552, 553 relative to one another, and combine them into a single, combined output signal which is output on the output 590 of the circuit 500, to be used as an address offset.

The first control input 530 is arranged to receive a signal indicating the size of each coordinate, e.g. usize=3, vsize=6, ssize=4 as in the example of FIGS. 6a-b. This input 530 is also implemented as a set of parallel wires, one control bit per wire, with enough wires to indicate the maximum size of each coordinate u, s, v in binary. The second control input 540 receives two control signals: the smallest coordinate's size A (the size of the smallest one of usize, vsize and ssize), and the next largest coordinate's size B (the size of the next largest of usize, vsize and ssize). Again this input is implemented as parallel wires with enough wires to accommodate the maximum number of bits that might be required to communicate this information in binary. The third control input 560 receives another one or more control signals for controlling the packing circuitry. In embodiments, as will be discussed in more detail later, this need only be a single 1-bit control signal input to the packing circuitry 508 in the 2-coordinate channel 552 for indicating whether or not a particular one of the coordinates (e.g. s) is the smallest. The control signals on the first, second and third control inputs 530, 540, 560 may be calculated automatically by dedicated hardware based on the texture supplied by the software. Alternatively they could be input explicitly by the software.

At stage (1), for each dimension, the mask 502 masks the unused most-significant bits (MSB) of the respective coordinate. The masking is done based on the coordinate size values usize, vsize, ssize as input on the first control input 530. Masking here means setting the masked bits to a fixed mask value. The mask value is 0 in the described implementation where the later combining in the shift-and-combine circuitry 520 is based on a Boolean OR, but in alternative implementations based on combining with Boolean ANDs, the mask value would instead be 1. The bits that are masked in this stage are any bits of the coordinate inputs (uvalue, vvalue, svalue) that have an index larger than the size of their respective coordinate inputs, as indicated by usize, vsize and ssize.

The mask 502 and stage (1) are not essential. In principle if the inputs uvalue, vvalue, svalue are properly defined, i.e. the unused MSB are already set to zero, then the mask 502 should not be needed. E.g. the software may make sure there are no stray 1s in the upper bit range. However if this is not enforced in the software or some earlier hardware stage (not shown), then there could be some stray or random values in the upper, currently-unused bit positions. E.g. these bits could be left over in registers or memory from which the texture is supplied, left over from an earlier, larger texture, if they are not properly zeroed by the software or an earlier hardware stage when supplying the current texture. Therefore the mask 502 may be beneficial in some embodiments.

If the mask 502 is not used, the coordinate input 590 is supplied directly to the interleaver 504. Otherwise the masked versions of the coordinate values are supplied to the interleaver 504 from the mask 502.

At stage (2), the interleaver 504 receives the masked versions of the coordinate values uvalue, vvalue, svalue from the mask 502 (or simply receives the input values from the input 501 of the circuit 500 if no mask 502 is used). The three coordinate value are all interleaved with one another, prior to being demultiplexed into separate channels 551, 552, 553 at the next stage (3).

Note: the interleaver 504 may represent any circuitry for interleaving the bits in the disclosed manner by any physical means. For instance, in embodiments it is implemented only by a rearranging or regrouping of the physical wires that carry bit data from all of the input bit-strings—effectively, a regrouping from groups of input bit-strings (coordinates) to groups per bit position. Alternatively the interleaver 504 could be implemented as a block interleaver or convolutional interleaver, which comprise hardware logic such as shift registers. In another example, the input bit strings may be loaded into the rows of a table or 2D array, such that the bit positions are aligned in the columns. The bits may then be read out column-wise, such that the bits from the different input bit-strings that have the same bit-position are grouped together. As would be understood, in an alternative the rows and columns of this example may be swapped so that the input bit strings are written into the columns and grouped bit-strings read out from the rows. It will be appreciated that these are just examples and the interleaver 504 is not limited to any particular physical implementation. More generally, the interleaver could be implemented as any grouper or grouping circuitry, and the interleaving could also be described as a grouping, that groups together bits from different input bit-strings that have the same bit-position. Any reference herein to interleaving could also be replaced with "grouping", and any reference to an interleaver or interleaving circuitry could be replaced with "grouping circuitry".

In embodiments, some of the coordinates may have a different maximum size compared to one another. E.g. in the illustrated example, s has a smaller maximum size (11 bits), whilst u and v have a larger maximum size than s but the same maximum size (15 bits each) as one another. In other embodiments the different coordinates could all have different maximum sizes compared to one another, or could all have the same maximum size as one another.

Within each coordinate value, each bit may be described as having an index i, which denotes the bit position of the bit in the original input value uvalue, vvalue or svalue respectively, where i=0 denotes the least significant bit and i=usize−1, i=vsize−1 or i=ssize−1, respectively, denotes the most significant bit.

The three coordinates are 3-way bit interleaved (i.e. interleaved bit-by-bit) for the indices up to the lowest maximum size. In the example implementation these are the bits up to and including the eleventh bit of each coordinate, in range i=0 . . . 10. For larger indices up to the larger maximum size, the two coordinates with the larger maximum size are 2-way interleaved (assuming the two have the same maximum size). In the example implementation these are the twelfth to fifteenth bits of u and v (i≥11). If the three coordinates all had a different maximum size, there would be an additional portion appended in the MSBs with only the bits of the coordinate with the coordinate with the largest maximum size. If all three coordinates had the same maximum size on the other hand, they would all simply be 3-way interleaved over the whole range. Note that the interleaving includes bits from all upper bit positions (all indices) up to the maximum possible size of each coordinate, even if there is no coordinate data in those bit-positions (so where a mask 502 is used, the interleaving includes the mask bits as well as the actual data bits). The bits originating from bit positions with no actual coordinate data may be referred to as no-data bits. Of course the bit in question may have to take one binary value or the other (e.g. the mask value if the mask 502 is used), but it is nonetheless described herein as a "no data" bit in the sense that it conveys no actual application data content.

In the illustrated implementation, the maximum size of the s coordinate is 11 bits and the u and v coordinates can be larger, with a maximum size of 15 bits each. So the three coordinates will be 3-bit interleaved up to and including index 10, but from there up, only u and v will be 2-bit interleaved up to 15 bits (in the range i=11 . . . 14). So the interleaving is done all the way up to 11 bits for the three-way interleaving of u, v and s, and then up all the remaining way up to 15 bits for the remaining bits of u and v; including any no-data MSBs (e.g. masked bits), even if the actual size of u, v and s happens to be smaller in any given use case (e.g. 3, 6 and 4 bits in the example of FIGS. 6a-b).

If the GPU were such that all coordinates have a different maximum size, there would also be a section above the 2-bit interleaved part where the remaining bits of the largest maximum size coordinate would go.

The interleaved signal 535 output by the interleaver 504 may be described as consisting of a plurality of groups, where each group consists of the bits of a given index (i.e. from a given bit position). So group 0 is s[0]v[0]u[0], group 1 is s[1]v[1]u[1], group 2 is s[2]v[2]u[2], etc. as shown in FIGS. 6a-b. For a given implementation, the relative order of u, v and s is always the same within each group, and stays the same throughout the circuit 500. A different implementation may use a different order, but by way of example the order of the coordinates in the described examples is s, v, u from most to least significant.

At stage (3) the demultiplexer 506 then demultiplexes this interleaved signal 535 from the interleaver 504 into three demultiplexed signals 545iii, 545ii, 545i; a respective one for each of the channels 553, 552, 551, The de-multiplexing is based on the size A of the smallest coordinate, and the size B of the next largest coordinate, as signalled on the second control input 540.

The 3-coordinate channel 553 is provided in order to handle the LSB range that contains actual data bits in of all three coordinates. The 2-coordinate channel 552 is provided to handle the middle-most significant bit range which contains actual data bits for only two of the coordinates. The 1-coordinate channel is provided to handle the most significant bit range that has actual data bits only for the largest coordinate. In other words, the 3-coordinate channel 553 is there to process the groups of bits, from the interleaved signal 535, with an index i at which all three coordinates have actual coordinate data. The 2-coordinate channel 552 is there to process the groups of bits with an index i where only the two largest coordinates have actual coordinate data (and there is one no-data bit per group). The 1-coordinate channel 552 is there to process the groups of bits with an index i where only the largest coordinate has actual coordinate data (and there are two no-data bits per group).

Each of the demultiplexed signals 545i, 545ii, 545iii has the same size as the interleaved signal 535, but is padded with null bits (dummy bits) in the bit ranges not handled by the respective channel. In other words, each interleaved signal 545 comprises groups of bits corresponding to all the groups (the group of every index) from the interleaved signal 535, in the same order; but for groups outside the range handled by the respective channel, all the bits of those groups are set to the null value. So in the 3-coordinate channel 553, all the bits of all the groups above the highest index at which all three coordinates have coordinate data (above i=2 in the illustrated example of FIG. 6a) are set to the null value. In the 2-coordinate channel 552, all the bits of all the groups above the highest index at which at least two coordinates have coordinate data (above i=3 in the illustrated example), and all the bits of all the groups below the lowest index at which only two coordinates have coordinate data (below i=3 in the illustrated example), are set to the null value. In the 1-coordinate channel 551, all the bits of all the groups below the lowest index at which only one coordinate has coordinate data (below i=4 in the illustrated example) are set to the null value. The setting of these null bits is done by the demultiplexer 506.

In addition, in each group within the respective bit range that is handled by the respective channel, any no-data bits are also set to the null value as well (e.g. because they have already been masked, or set to that value initially by the software). So in the 2-coordinate channel 552, one bit is set to 0 where the smallest coordinate bit would be for this index, and similarly for the no-data bits in the 1-coordinate channel 551. This could be because they have already been masked to the mask value (which is the same as the null value) by the mask 502, if used. Alternatively it could be because the software already set them to the null value in the original input bit-strings at the circuit input 501. Alternatively these null bits could be set by the demultiplexer 506 (though this would require some other control input to signal to the demultiplexer 506 which were the no-data bits).

Thus, in the 3-coordinate channel 553 the respective demultiplexed signal 545iii comprises the least-significant bit range or portion from the interleaved signal 535 (where all three coordinates have actual data per group of three interleaved bits), and above that is padded with null bits corresponding to the groups in the middle-most and most significant ranges. In the 2-coordinate channel 552 the respective demultiplexed signal 545ii comprises the middle-most significant bit-range or portion from the interleaved signal (where there are only two actual data bits per group of interleaved bits), and above and below that is padded with null bits in the least and most significant bit ranges. In the 1-coordinate channel 551, the respective demultiplexed signal 545i comprises the most-significant bit-range or portion from the interleaved signal 535 (where the groups have only one actual data bit per group of three interleaved bits), and below that is padded with null bits. The groups outside the range handled by the respective channel, padded purely with null bits, could be referred to as null or "dummy" groups. These are the greyed-out groups shown in FIGS. 6a-b.

Refer again to FIG. 6a, which shows the null bits blacked-out. In the interleaved signal 535 as input to the demultiplexer 506, in this example the no-data bits have already been set to the null value by the mask 502 or by the software. In each demultiplexed signal 545i, 545ii, 545iii, additional null bits have then been introduced by the demultiplexer 506 in the groups outside the range handled by the respective channel 551, 552, 553.

In the illustrated implementation the null bits are 0, as the combining later in the shift-and-combine circuitry 520 is based on bitwise Boolean ORs. However the null bits would instead be 1 if, in an alternative implementation, the combining in the shift-and-combine circuitry 520 was instead based on bitwise Boolean ANDs.

At stage (4), in each of the two higher order (1- and 2-coordinate) channels 551, 552 that have MSBs corresponding to no actual data from one or more smaller coordinates, the strings of bits are packed down to remove the no-data bits. E.g. say the u coordinate was smallest: in that case, in the 2-coordinate channel 552, there will be nulled no-data bits corresponding to MSB bit-positions that were beyond the size of the actual u value. These are removed by the first packing circuitry 508. Similarly the second packing circuitry removes the no-data bits corresponding to the unused bit positions of the smallest coordinates in the 1-coordinate channel 551

To elaborate, the process may also be described this in terms of groups of interleaved bits that have the same index in the input coordinate signals. For example, the group for index i would be s[i]v[i]u[i], from MSB to LSB. The groups with indices smaller than the size of the smallest size coordinate are handled in the 3-coordinate channel 553, the groups with indices larger than or equal to the smallest size but smaller than the second biggest size coordinate go to the 2-coordinate channel 552, and the remaining groups (index larger than or equal to the second biggest size coordinate) go to the 1-coordinate channel 551.

In the 3-coordinate groups, all bits contain valid coordinate data (the 'real data' or 'actual data'). As such, there are no gaps with non-valid (no-data) bits between bits with valid data in these groups.

In the 2-coordinate groups that have indices where three bits can be interleaved (i.e. index smaller than the smallest max coordinate size, so i<11 in the example implementation shown), there will be one bit out of three that has non-valid data and is therefore equal to the null value. This is the bit that originated from the coordinate with the smallest size in the texture. Above the lower maximum size (i≥11 in the example implementation shown), where groups have only two bits interleaved, there are no non-valid bits, similar to the situation in the 3-coordinate groups described above. In a different implementation, if all the coordinates had the same maximum size, all the 2-coordinate groups would simply have one null bit.

For 1-coordinate groups, only one of the three or two bits in the group has valid data, and the other bit(s) in the group must have non-valid data, and therefore the null value. Note that if the configuration of the GPU were such that all three coordinates have a different maximum size, then there would also be a section where the index groups have only 1 bit. Again, in this case there are no 'gaps' of non-valid bits between valid bits, such as described in the paragraph on the 3-coordinate channel.

The 'packing' that happens in the 2- and 1-coordinate groups consists of eliminating the 1 or 2 bits per group that do not have valid data. It can be seen as a 'packing unit' per group, for both the 1- and 2-coordinate channels. The 2-coordinate channel hereby produces groups of 2 bits, and the 1 coordinate channel produces a single bit per index. An example implementation of this packing will be discussed shortly with reference to FIGS. 7a-d.

Note that the groups made up of only null bits—i.e. the "dummy" groups outside the range of indices handed by the respective channel (the greyed-out groups in FIGS. 6a-b)—are also packed down by the same number of bits in the respective channel. So in the 1-coordinate channel 551, two out every three bits are removed from the null groups (the groups below the lowest index at which only one coordinate has coordinate data, e.g. below i=4 in the illustrated example). And in the 2-coordinate channel 552, one out of every three bits is removed from the null groups of that channel (the groups above the highest index at which at least two coordinates have coordinate data, so above i=3 in the illustrated example, and all the bits of all the groups below the lowest index at which only two coordinates have coordinate data, which are those below i=3 in the illustrated example).

In embodiments, this packing of the null or "dummy" groups may be done by the same packing circuitry 508, 510 as used to remove the no-data bits from the respective groups in the range handed by the respective channel 552, 551. Alternatively it could be done by a separate module that simply removes the unwanted null bit(s) from any position from the respective dummy groups in each channel. However, if this can be implemented by the same packing logic 508, 510 as used to remove the no-data bits from the non-dummy groups (the groups in the ranged handled by the respective channel), then the packing will be more efficient in terms of silicon usage.

At stage (5), in the shift- and combine circuitry 520, the bit strings are left shifted to align them to the correct bit positions relative to one another, and combined by means of bitwise ORs.

The value output on the output 590 of the circuit 500 is supplied onwards to a memory access stage of the processor (not shown) where it is used to calculate the corresponding memory address for the texture value associated with the point in the texture defined by the set of coordinates that were input at the coordinate input 501. This may be done by multiplying the offset by the number of memory addresses needed to store the texture value of one texel (the number of addressable bytes or words needed per texel's texture value), and adding to a base address. This calculation by the memory access stage may also be implemented in dedicated hardware, though a software implementation is not excluded.

The process described in relation to FIGS. 5 and 6a-b may be repeated for one or more further sets of coordinates in the texture in order to map a part or the whole of the texture to memory. If the GPU is systematically accessing an entire texture, then the process will be repeated for each set of coordinates in the texture. However, often the access is more random, and the GPU will be accessing a texel or groups of texels when required to render a pixel.

From the above description, and studying the examples of FIGS. 6a-b, it can be seen that the disclosed circuit 500 is able to interleave the coordinate data bits without the need for any right shifting. Also, the packing 508, 510 effectively replaces some of the left shifting. As such the circuit 500 performs the interleaving of coordinate data bits with a reduced amount of shifting compared to the circuit 300 of FIG. 3, and thus significantly reduces the complexity of the circuit.

The shift-and-combine circuitry 520 is preferably arranged into the form of cascaded shift-and-combine circuitry. This provides a particularly efficient implementation of the shifting, requiring only two simple left shifts: one by the smallest coordinate size A and one by the next smallest coordinate size B.

The cascaded shift-and-combine circuitry 520 comprises: a first cascade stage 512, 514 associated with the 2-coordinate channel 552; and a second cascade stage 516, 518 associated with the 3-coordinate channel 553. The first cascade stage comprises a respective first left shifter 512 and respective first combining circuitry 514. The second cascade stage comprises a respective second left shifter 516 and respective second combining circuitry 518. In embodiments the combining circuitry 514/518 in each stage comprises an OR unit which may be implemented using a set of OR-gates to perform a bitwise OR.

In operation, the first left shifter 512 left-shifts the output 561 of the 1-coordinate channel 551 by B (the size of the smallest coordinate, as indicated via the second control input 540). The shifted output 565 of this is then combined with the output 562 of the 2-coordinate channel 562 by means of a bitwise OR, performed by the first OR gate 514, thus producing a partial output signal 570. The second left-shifter 516 then left-shifts this partial output signal 570 by A (the size of the second largest coordinate). The shifted output 575 of this is then combined with the output 563 of the 3-coordinate channel 553 by means of another bitwise OR, performed by the second OR gate 518, thus producing the final output bit-string 590.

Because in each of the higher-order channels 551, 552, the signal is already packed down by a corresponding number of bits, this means that only a simple shift left by A and then B is needed at each respective cascade stage. No computation of 3A or 2(B−A) is required as in FIG. 3.

To understand the shifts, remember that in the 2-coordinate channel the 3-bit groups are packed to 2-bit groups before they are shifted. Similarly, in the 1-coordinate channel these groups are reduced to 1 bit. In the example shown in FIGS. 6a-b, the highest valid bit in the 2-coordinate channel (s3) is at position 11 before the packing, but at position 7 after the packing (now referring to the position in the interleaved string). The lowest valid bit in the 1-coordinate channel (v4) is first at position 13, but after the packing it is at position 4.

Then when the packed 1-coordinate channel needs to be shifted so that it can be ORed with the 2-coordinate channel, the lowest valid bit in the 1-coordinate channel needs to be placed one position higher than the highest valid bit in the 2-coordinate channel. Because the former is at position B (4 in the example in FIG. 6b), and the latter is at position 2*B−1 (2*4−1=7), the 1-coordinate channel requires a shift of B to align properly.

The same approach is then applied to shifting the 1 & 2-coordinate combined signal: the lowest valid bit of this signal needs to be 1 position higher than the highest valid bit of the 3-coordinate channel. Because the former is at position 2*A (2*3=6) and the latter is at 3*A−1 (3*3−1=8), this requires a shift of A bits.

With regards to the greyed-out groups of bits in the three channels (the dummy groups), these can be seen as physical wires that happen to be not valid/nulled for this set of texture dimensions. If a different set of dimensions were used (for example, a 2-dimensional texture with usize=6, vsize=7 and ssize=0), then different groups would be 'greyed out', but the wires are still there at all times. The grey simply indicates that these bits do not carry data that is of interest in this particular channel, and therefore are nulled.

FIGS. 7a-d show a particularly advantageous implementation of the packing circuitry 508, 510, which may optionally be employed to further reduce the complexity of the circuit 500 in accordance with certain embodiments disclosed herein.

Figure 7A:
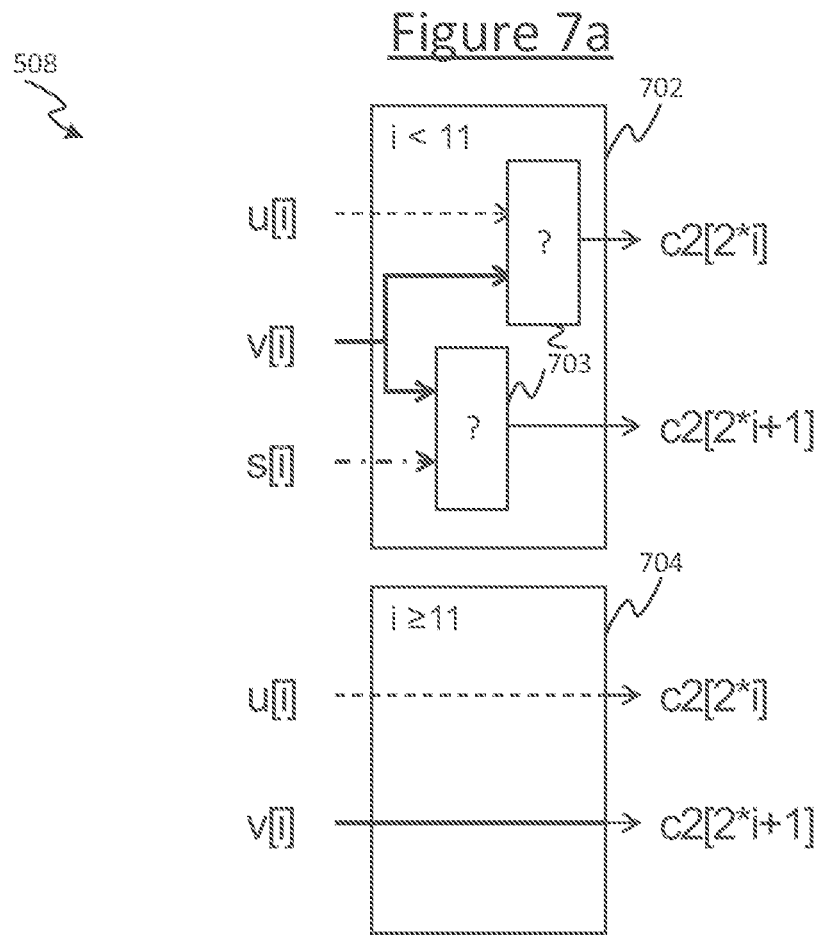

FIG. 7a represents the functionality to be implemented in the first packing circuitry 508 (for use in the 2-coordinate channel 552). For indices i up to the lower maximum size (the maximum size of s in the example, which is 11 bits in the particular example implementation shown), the first packing circuitry 508 comprises a first logic path 702 comprising selector circuitry 703 which selects, on a bit-by-bit basis, whether to output the current bit of u or v on a first output line, and whether to output the current bit of v or s on a second output line. For indices beyond the lower maximum size (i≥11 in the example), the first packing circuitry 508 comprises a second logic path 704 simply comprising two wires which pass along u and v only.

FIG. 7c represents the functionality to be implemented in the second packing circuitry 510 (for use in the 1-coordinate channel 551). For indices i up to the lower maximum size (the maximum size of s in the example, which is 11 bits in the particular example implementation shown), the second packing circuitry 510 comprises a third logic path 706 comprising selector circuitry 707 which selects, on a bit-by-bit basis, whether to output the current bit of u, v or s on a single output line. For indices beyond the lower maximum size (i≥11 in the example), the second packing circuitry 510 comprises a fourth logic path 708 comprising selector circuitry 709 which selects, on a bit-by-bit basis, whether to output the bit of u or v on the output line.

FIGS. 7a and 7c are somewhat schematized. In FIG. 7a the first and second logical paths 702, 704 are not necessarily implemented as two distinct modules and may be incorporated together in a synergistic piece of logic. Similar comments apply to the third and fourth logic paths 706, 708 in FIG. 7c. Also, in FIG. 7a, the selector circuitry 703 is not necessarily implemented as two distinct blocks.

In the circuit of FIG. 3, the selection between u, v and s is always performed by multiplexers 308, 310. A multiplexer makes its selection purely based on a control signal (360 in the case of FIG. 3), and does not operate in any way in dependence on what the data content of its data inputs. I.e. the selection is independent of what data is being selected between.

However, external control signals add complexity which it would be desirable to reduce. Input wires have a large fan-out (the signal has to be driven to a lot of gates), and the signal will likely have to be reinforced with buffers, or the transistors that drive the signal will need to be larger. This adds to the area more than an additional data bit would, for example. Also, having less inputs will decrease the complexity of a packing unit, and those gains are multiplied by the number of units. This complexity saving is most notable in the packing units of the 1-coordinate channel, where instead of having a 3 or 2 input multiplexer consisting of multiple logic gates there is now only a single OR-gate.

The inventor has recognized that, in a circuit of the type described with reference to FIG. 5, the demultiplexing and packing has already introduced some information which can be used to inform the selection in the packing circuitry 508, 510 and thus reduce the amount of external control signals 360/560.

Hence in particularly advantageous (but not essential) embodiments, the selector circuitry 703, 707, 709 can be configured to take into account the content of its inputs in order to make its selection (accordingly this selector circuitry is not referred to as multiplexers).

There are a number of assumptions that can be made about the packing circuitry inputs, which result in efficient logic that only requires one bit to select the output. This is another improvement over the multiplexers in the previous implementation, that required two 2-bit select signals to produce the correct output. The assumptions are as follows.

Firstly, each channel (1-, 2-, or 3-coordinate) considers groups from a specific range of indices, as determined by the sizes of the coordinates. If the index of the group is outside the range that this channel looks at, then the inputs and outputs of the packing unit for this group should all be 0.

Secondly, if the index of the group is within the range that this channel handles, then for the 2-coordinate channel there is exactly 1 input bit that is always 0, because it contains non-valid data. For the 1-coordinate channel, there are exactly 2 non-valid bits in the range of indices it handles. For both channels, any non-valid bits will be 0.

Thirdly, for groups in the 2-coordinate channel where there are 3 bits at the input of the packing unit and 2 bits at the output, the bits are arranged svu at the input, from MSB to LSB. Because there are 2 outputs, and the data at the input cannot change order, the possible outputs are: sv, su, vu. This means that s can only end up on the MSB output bit, u can only end up on the LSB output bit, and v can end up on both output bits.

Using these assumptions, a truth table for the packing unit can be filled in where it becomes clear that for all but one possible combination of input bit values, the output can be derived solely by looking at the input values. Note: the truth table need only consider input combinations that are possible (u, v and s all being 1 is a situation that cannot occur in the 2-coordinate channel, so it does not matter what the output would be for that situation).

Table 1 below shows the truth table for the first logic path 702 of the first packing circuitry 508 in the 2-coordinate channel 552 (the second logic path 704 can just consist of wires). As can be seen, the only input combination that needs an additional bit of input data, is the input where svu==010: In this case the output may be 10 or 01, depending on whether the s or the u coordinate has the smallest size.

TABLE 1

| u[i] | v[i] | s[i] | c2[2i] | c2[2i + 1] |
|---|---|---|---|---|
| 0 | 0 | 0 | 0 | 0 |
| 0 | 0 | 1 | 0 | 1 |
| 0 | 1 | 0 | ? | ? |
| 0 | 1 | 1 | 1 | 1 |
| 1 | 0 | 0 | 1 | 0 |
| 1 | 0 | 1 | 1 | 1 |
| 1 | 1 | 0 | 1 | 1 |
| 1 | 1 | 1 | N/A | N/A |

Figure 7B:
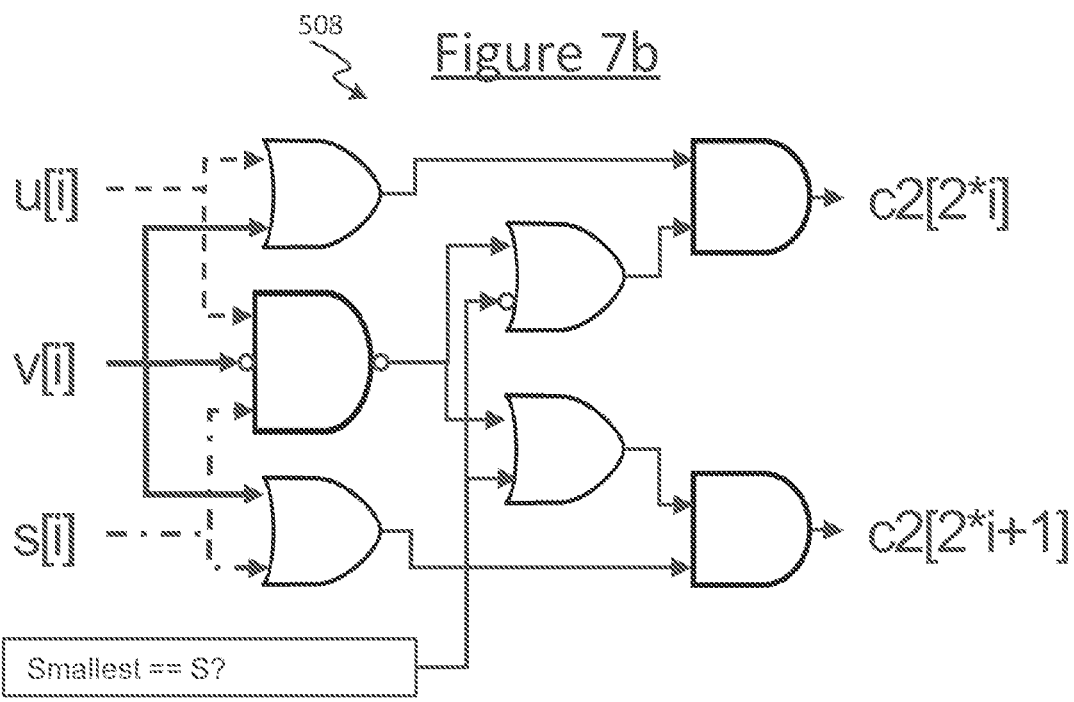

FIG. 7b shows an example implementation of the first packing circuitry 508 based on the above truth table. This is just one possible implementation in actual logic, and it will be appreciated that once given the principle described above, the person of ordinary skill would be able to use conventional logic design tools to come up with other logic having the same functionality.

In the illustrated example, the situation svu==010 is disambiguated using a 1-bit input signal that indicates whether or not s is the smallest coordinate. Alternatively however a signal indicating whether or not u is the smallest could be used (though a signal indicating whether v is smallest would not give the required information to make this selection).

FIG. 7d shows the simple logic that can be used in the second packing circuitry 510 in the 1-coordinate channel 551. Here, no external signal is needed at all, and all the necessary information is already provided in the input data itself.

To recap some of the various teachings above, the new implementation interleaves all three coordinates first. Because in embodiments u and v can be 15 bits wide, and s only 11 bits, there are two parts of this interleaved signal: up to index 11 all three coordinates are interleaved, above index 11 only u and v are interleaved. The resulting interleaved signal can be split into groups of 3 or 2 bits that had the same bit index in the original texel coordinate signals.

These groups of 3 or 2 bits are then demultiplexed into one of three channels, depending on the original index of the bits. If this index is smaller than the width of the smallest texture coordinate, the group is sent to the 3-coordinate channel. If the index is larger than or equal to this smallest width, but smaller than the second largest width, it is sent to the 2-coordinate channel. All remaining groups go to the 1-coordinate channel. Of the three resulting signals, all bits that are not driven by the demultiplexer are set to 0.

The signal demultiplexed to the 1-coordinate channel consists of groups of 3 or 2 bits, but at most one bit per group carries valid data at any time, while all other bits are 0. Instead of using a multiplexer to select the bit with valid data, the correct output can be determined simply by taking an OR of the 3 or 2 input bits. Applying this OR to all groups produces a 15-bit wide signal, where any bits with valid data form a contiguous section of the signal.

Similarly, in all groups of the 2-coordinate channel signal, either two bits carry valid data while the other is 0, or all bits are 0. Every group must be reduced to a group of 2 bits, where either both bits carry valid data, or both bits are 0. Valid output bits must be in the same order they were in at the input. A naïve implementation of this 'packing' would require two multiplexers, one for each output bit. However, using the knowledge of the possible input values, these full multiplexers can be avoided. First, if the group only has 2 bits, no selection or multiplexing is required, and inputs can be directly connected to outputs by wires. If the group has 3 bits, the outputs can be determined without any knowledge of which bits carry valid data for all but one input combination:

If all three input bits are 0, the output must be 00.
If the MSB or LSB input bit is 1 while the two other bits are 0, the output must be 10 or 01 respectively.
If two input bits are 1 and one input is 0, the output must be 11.
All three bits being 1 is not a valid input, so the output is don't care.

This leaves only the case where the input bits are 010: the output can be either 01 or 10, depending on whether the LSB or MSB input bit does not carry valid data. This requires a 1-bit select signal, which is the same for all groups. This packing for the 2-coordinate channel results in a 30-bit wide signal, where any bits with valid data form a contiguous section of the signal.

The final step of calculating the address offset is combining the signals from the 1-, 2- and 3-coordinate channels. This is done using a cascaded shift and OR operation. First, the 1-coordinate signal is left shifted by the width of the second largest texture coordinate (maximum shift width: 15 bits). This aligns the section with valid data so that its lowest bit is exactly one index above the highest valid bit of the 2-coordinate interleaved signal. Because all bits outside of the valid section of a signal are 0, these signals can be combined with a bitwise OR. The result is again left shifted, this time by the width of the smallest texture coordinate. The resulting signal can be combined with the 3-coordinate interleaved signal by a bitwise OR. This produces the required twiddled address offset.

This approach resulted in a 55% area saving over the old implementation, mainly due to less shifters and the elimination of full multiplexers.

Notable aspects of various embodiments of the design include:

The 2-to-1 and 3-to-1 packing units in the 1-coordinate channel. Using the knowledge that at most one input can have a non-zero value, a multiplexer can be replaced by an OR gate. This also avoids wiring overhead for the select signals. This can be generalised to an X-to-1 packing unit.
The 3-to-2 packing units in the 2-coordinate channel. Using the knowledge that either 2, or 0 bits can have non-zero values, the output can be determined by only looking at the inputs for all but one input combination.
The cascaded shift and bitwise OR to construct the twiddled address offset from the 1-, 2- and 3-coordinate signals. By performing this step in a cascaded way, the shift widths are minimal, saving area.

As another note, shifter 316 in FIG. 3 would be smaller in area than shifter 318. This is because it can only shift in multiples of 3, which means that the multiplexers that drive its outputs only have a third of the number of inputs (as there is no use having inputs for shift lengths that can't occur), in this case 15 bits. Shifter 318 on the other hand will need multiplexers that have many more inputs, because the formula $3*A+2*(B-A)$ can result in just about every shift length between 0 and 41. However both shifters will still be quite wide, as they both have 41 output bits, and therefore 41 multiplexers. On top of that we have right shifters 304 and 306, which again just about doubles the number of multiplexers required for the shifters.

In the improved implementation of FIG. 5, shifters 512 and 516 both have a maximum shift length of 15 bits, and are also less wide, 15 and 30 bits respectively. Because on top of that, there are no right shifters in this design, this gets rid of a lot of the multiplexers that were required in the previous implementation.

It will be appreciated that the above embodiments have been described by way of example only.

For instance, as mentioned, the scope of the disclosed circuit is not limited to textures, and could be used for calculating addresses for storing any multidimensional array of data, whether a texture, an image in some other image processing application, or an array comprising non-image data in an AI application or such like.

Further, the circuit could be extended to handle data of any number of dimensions, whether two, three, four or more dimensions. A generalization of various of the disclosed features to N dimensions may be described as follows.

The circuit comprises an input arranged to receive a set of N input bit-strings each comprising a respective coordinate of a set of N coordinates defining a point in N dimensions, where $N \geq 2$. Each input bit-string comprises at least a first portion (e.g. the first 11 bits in various examples described above implementation), wherein the first portions are the same fixed number of bits in size as one another. Within each input bit-string each bit has a corresponding bit position, from least to most significant within the bit-string. The circuit is capable of accommodating different size coordinates, whereby in one or more of the input bit-strings the respective coordinate occupies only some of the bit positions with actual coordinate data representing the respective coordinate. The coordinate data is located in the least significant bit positions while any non-data bits not representing the respective coordinate are located in the most significant bit positions.

The circuit further comprises an interleaver, which may comprise any interleaving circuitry arranged to bit-interleave the input bit-strings, including non-data bits, to produce an interleaved bit-string in which the bits are grouped into groups of bits originating from the same bit position per group. The interleaving comprises N-way interleaving the first portions.

The circuit further comprises a demultiplexer operable to demultiplex the interleaved bit-string into $n=1 \ldots N$ demultiplexed bit-strings (i.e. demultiplex the groups of bits that have the same bit position) and send each to a respective n-coordinate channel. The nth demultiplexed bit-string comprises: a) a respective part of the interleaved bit-string in which there are n coordinate data bits and N-n non-data bits per group, and b) all the other groups filled with null bits, unshifted relative to the respective part.

In embodiments the interleaving may be implemented merely by a regrouping of the physical wires that carry bit data from all of the input bit-strings—i.e., a regrouping from groups of input bit-strings (coordinates) to groups per bit position. One could also describe what happens as bits from different input bit-strings that have the same bit-positions being grouped together, and these groups being then demultiplexed to the N channels.

Each but the N-coordinate channel comprises bit packing circuitry arranged to pack down the respective demultiplexed bit-string into a respective packed bit-string, by removing the no-data bits from said respective part, and removing the same number of bits per group from the null bits.

The circuit further comprises shift-and-combine circuitry. This is arranged to shift the packed bit-strings to align them relative to one another according to the corresponding bit positions, and to combine the shifted bit-strings, thereby producing a combined output bit-string In embodiments, the circuit may comprise an output arranged to output the combined output bit-string as an address offset to a memory access stage of the processor, in order to cause the memory access stage to compute a memory address from which to read a value, e.g. a texture value, associated with the set of coordinates. As such, the circuit may be located within a texture processing unit of the GPU. However, while embodiments earlier in the description may have been described in terms of such an application by way of example, any of the disclosed twiddling techniques could also be applied to other applications. Another example application would be in a GPU's pixel output module which outputs rendered image pixels to a frame buffer or other memory. The disclosed twiddling techniques may be used to compute the addresses at which to write rendered image pixels, which may then be read by any other unit which is able to read data in the same twiddled format. For example, the rendered pixels may be read as texture values by a texture processing unit for use in another render. The disclosed twiddling techniques may also be applied to non-memory applications. For example, a data word may be used to represent a mask or to store other data which relates to a 2D or 3D array of pixels. The mask may indicate a property (e.g. transparency) of the pixels, or may indicate a subset of the array of pixels to which processing should be applied. The disclosed twiddling techniques may be used to map from the multi-dimensional pixel coordinate to the location of the corresponding bit or bits in the data word. More generally, the disclosed twiddling circuit could be used in any application which involves mapping an N-dimensional system of integer coordinates to an 1-dimensional system, memory or otherwise.

In embodiments where cascaded shift-and-combine circuitry is used, this may be generalized to N dimensions as follows. The packed bit-string output by the 1-coordinate channel provides a first respective partial output bit-string. For each of the other n-coordinate channels from n=2 . . . N, the shift-and-combine circuitry comprises a respective nth cascade stage, each but the Nth providing a further respective partial output bit-string and the Nth providing the combined output bit-string to use as the output of the twiddling circuit as a whole (e.g. to use as the address offset).

Each nth cascade stage comprises a respective left-shifter arranged to left shift the partial output bit-string of the (n−1)-coordinate channel by the bit width of the nth largest dimension—or equivalently the (N−n+1)th smallest dimension—in order to produce a shifted packed bit-string aligned relative to the unshifted packed bit-string from the n-coordinate channel. Each nth cascade stage also comprises respective combining circuitry, arranged to combine the shifted packed bit-string from the respective left-shifter with the unshifted packed bit-string from the n-coordinate channel, thereby providing the respective partial output bit-string for each of n=2 . . . (N−1) or the combined output bit-string for n=N, respectively.

This is because the upper boundary of valid data in the packed bit-string output by the n-coordinate channel is at n*(bit-width of coordinate of n'th largest dimension)−1 and the lower boundary of the respective partial output bit-string of the (n−1) coordinate channel is at (n−1)*(bit-width of coordinate of n'th largest dimension). So to align them, the (n−1) coordinate output is left shifted over the bit width of the coordinate with the n'th largest dimension.

In some embodiments, M of the input bit-strings each further comprise a second portion comprising one or more bits at more significant bit positions than the first portion, where 1≤M<N and (if M>1) the second portions are the same fixed size as one another. This means that the coordinates of the M input bit-strings have a larger maximum size being the size of the first portion plus the second portion, and the coordinates of the other N−M bit-strings have a smaller maximum size being the size of the first portion only. In this case (if M>1) the interleaving further comprises M-way interleaving the second portions.

In some cases, another P of the input bit-strings may even have a larger maximum size than the M, where 1≤P<M. In this case, each of the P input bit-strings comprises a third portion, comprising one or more bits at more significant bit positions than the second portion. If P>1, each of the third portions is the same size as one another, and the interleaving furthers comprise P-way interleaving the third portion.

By way of example, in the case where N=3, M=2 and P=1, this gives a 3D texture with different respective maximum sizes for each of u, v and s. More generally, any or all of the N input bit-strings could have different maximum sizes to one another.

Figure 8:
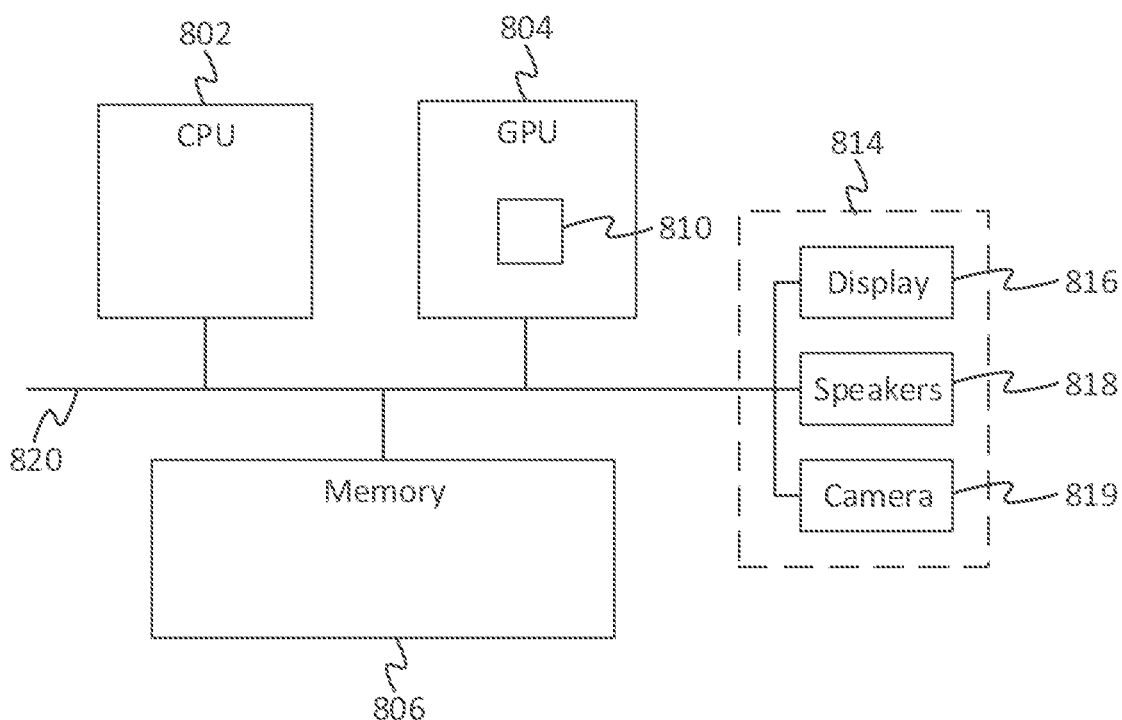
FIG. 8 is a schematic block diagram of a computer system in which a graphics processing system is implemented.

FIG. 8 shows a computer system in which the graphics processing systems described herein may be implemented. The computer system comprises a CPU 802, a GPU 804, a memory 806 and other devices 814, such as a display 816, speakers 818 and a camera 819. A processing block 810, including the circuit 500 disclosed above, is implemented on the GPU 804. In other examples, the processing block 810 may be implemented on the CPU 802. The components of the computer system can communicate with each other via a communications bus 820. The memory 806 may be used to store the texture at the addresses calculated by the disclosed 500. Alternatively the texture may be stored in an internal memory of the GPU 804 or CPU 802.

The circuit described herein may be embodied in hardware on an integrated circuit. The circuit described herein may be configured to perform any of the methods described herein.

The present disclosure also encompasses software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a circuit or processor configured to perform any of the methods described herein, or to manufacture a circuit or processor comprising any apparatus described herein. An integrated circuit definition dataset may be, for example, an integrated circuit description.

Therefore, there may be provided a method of manufacturing, at an integrated circuit manufacturing system, a circuit or processor as described herein. Furthermore, there may be provided an integrated circuit definition dataset that, when processed in an integrated circuit manufacturing system, causes the method of manufacturing a circuit or processor to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a circuit or processor will now be described with respect to FIG. 9.

Figure 9:
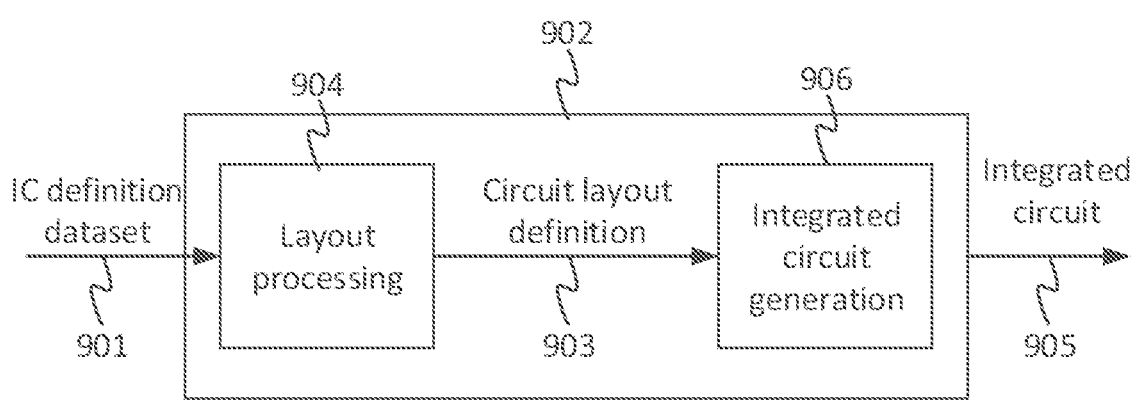
FIG. 9 is a schematic block diagram of an integrated circuit manufacturing system for generating an integrated circuit embodying a graphics processing system.

FIG. 9 shows an example of an integrated circuit (IC) manufacturing system 902 which is configured to manufacture a circuit or processor as described in any of the examples herein. In particular, the IC manufacturing system 902 comprises a layout processing system 904 and an integrated circuit generation system 906. The IC manufacturing system 902 is configured to receive an IC definition dataset (e.g. defining a circuit or processor as described in any of the examples herein), process the IC definition dataset, and generate an IC according to the IC definition dataset (e.g. which embodies a circuit or processor as described in any of the examples herein). The processing of the IC definition dataset configures the IC manufacturing system 902 to manufacture an integrated circuit embodying a circuit or processor as described in any of the examples herein.

The layout processing system 904 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 904 has determined the circuit layout it may output a circuit layout definition to the IC generation system 1006. A circuit layout definition may be, for example, a circuit layout description.

The IC generation system 906 generates an IC according to the circuit layout definition, as is known in the art. For example, the IC generation system 906 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 906 may be in the form of computer-readable code which the IC generation system 906 can use to form a suitable mask for use in generating an IC.

The different processes performed by the IC manufacturing system 902 may be implemented all in one location, e.g. by one party. Alternatively, the IC manufacturing system 902 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a circuit or processor without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 9 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 9, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

According to further aspects disclosed herein, there may be provided a corresponding method of operating the circuit or processor disclosed herein, and a corresponding computer program configured to operate the circuit or processor. According to yet further aspects there may be provided a corresponding method of manufacturing the circuit or processor, a corresponding manufacturing facility arranged to manufacture the circuit or processor, and a corresponding circuit design data set embodied on computer-readable storage.

For instance according to one aspect there may be provided a non-transitory computer readable storage medium having stored thereon a computer readable description of the circuit or processor of any embodiment herein which, when processed in an integrated circuit manufacturing system, causes the integrated circuit manufacturing system to: process, using a layout processing system, the computer readable description of the circuit or processor so as to generate a circuit layout description of an integrated circuit embodying said circuit or processor; and manufacture, using an integrated circuit generation system, the circuit or processor according to the circuit layout description.

According to another aspect, there may be provided an integrated circuit manufacturing system comprising: a non-transitory computer readable storage medium having stored thereon a computer readable description of the circuit or processor of any embodiment disclosed herein; a layout processing system configured to process the computer readable description so as to generate a circuit layout description of an integrated circuit embodying said circuit or processor; and an integrated circuit generation system configured to manufacture the circuit or processor according to the circuit layout description.

According to another aspect there may be provided a method of manufacturing, using an integrated circuit manufacturing system, a circuit or processor of any embodiment disclosed herein, the method comprising: processing, using a layout processing system, a computer readable description of said circuit so as to generate a circuit layout description of an integrated circuit embodying the circuit or processor; and manufacturing, using an integrated circuit generation system, the circuit or processor according to the circuit layout description.

According to another aspect there may be provided a layout processing system configured to determine positional information for logical components of a circuit derived from the integrated circuit description so as to generate a circuit layout description of an integrated circuit embodying the circuit or processor of any embodiment disclosed herein.

Other variants, implementations and/or applications of the disclosed techniques may become apparent to a person skilled in the art once given the disclosure herein. The scope of the present disclosure is not limited by the above-described embodiments but only by the claims.

What is claimed is:

1. A circuit for use in a processor, the circuit comprising:
an input arranged to receive a set of N input bit-strings each comprising a respective coordinate of a set of N coordinates defining a point in N dimensions, where N≥2, each input bit-string comprising at least a first portion wherein the first portions are the same fixed number of bits in size as one another, wherein within each input bit-string each bit has a corresponding bit position from least to most significant within the bit-string, and wherein the circuit is capable of accommodating different size coordinates whereby in one or more of the input bit-strings the respective coordinate occupies only some of the bit positions with actual coordinate data representing the respective coordinate, the coordinate data being located in the least significant bit positions while any non-data bits not representing the respective coordinate are located in the most significant bit positions;
grouping circuitry arranged to produce a grouped bit-string from the input bit-strings, in which the bits, including non-data bits, are grouped into groups of bits originating from the same bit position per group; and
a demultiplexer operable to demultiplex the grouped bit-string into n=1 . . . N demultiplexed bit-strings and send each to a respective n-coordinate channel, the nth demultiplexed bit-string comprising: a respective part of the grouped bit-string in which there are n coordinate data bits and N-n non-data bits per group, and all the other groups filled with null bits, unshifted relative to the respective part;
wherein each but the N-coordinate channel comprises bit packing circuitry arranged to pack down the respective demultiplexed bit-string into a respective packed bit-string by removing the non-data bits from said respective part, and removing the same number of bits per group from the null bits; and
wherein the circuit further comprises shift-and-combine circuitry, arranged to shift the packed bit-strings to align them relative to one another according to the corresponding bit positions, and to combine the shifted bit-strings, thereby producing a combined output bit-string.

2. The circuit of claim 1, further comprising an output arranged to output the combined output bit-string as an address offset to a memory access stage of the processor to compute a memory address in which to store a value associated with the set of coordinates.

3. The circuit of claim 1, wherein N is 2.

4. The circuit of claim 1, wherein N is equal to or greater than 3.

5. The circuit claim 4, wherein the shift-and-combine circuitry comprises cascaded shift-and-combine circuitry, whereby:
the packed bit-string output by the 1-coordinate channel provides a first respective partial output bit-string; and
for each of the other n-coordinate channels from n=2 ... N the shift-and-combine circuitry comprises a respective nth cascade stage, each but the Nth providing a further respective partial output bit-string and the Nth providing the combined output bit-string;
wherein each nth cascade stage comprises a respective left-shifter arranged to left shift the partial output bit-string of the (n−1)-coordinate channel by the bit width of the nth largest coordinate to produce a shifted packed bit-string aligned relative to the unshifted packed bit-string from the n-coordinate channel, and respective combining circuitry arranged to combine the shifted packed bit-string from the respective left-shifter with the unshifted packed bit-string from the n-coordinate channel, thereby providing the respective partial output bit-string for each of n=2 ... (N−1) or the combined output bit-string for n=N, respectively.

6. The circuit of claim 1, wherein the null-bits are 0, and the combining in the shift-and-combine circuitry is by bitwise OR.

7. The circuit of claim 1, wherein the null bits are 1, and the combining in the shift-and-combine circuitry is by bitwise AND.

8. The circuit of claim 1, further comprising masking circuitry arranged to mask each of the non-data bits to a mask value prior to input to the grouping circuitry.

9. The circuit of claim 1, wherein M of the input bit-strings each further comprise a second portion comprising one or more bits at more significant bit positions than the first portion, where $1 \leq M < N$ and if M>1 the second portions are the same fixed size as one another, such that the coordinates of the M input bit-strings have a larger maximum size being the size of the first portion plus the second portion, and the coordinates of the other N-M bit-strings have a smaller maximum size being the size of the first portion only.

10. The circuit of claim 9, wherein the size of each first portion is 11 bits and the size of each second portion is 4 bits, such that the M coordinates have a maximum size of 15 bits and the N-M coordinates have a maximum size of 11 bits.

11. The circuit of claim 9, wherein N=3 and M=2.

12. The circuit of claim 11, wherein one of the M coordinates has a larger maximum size than the other, comprising a third portion comprising one or more bits at more significant bit positions than the second portion.

13. The circuit of claim 1, wherein each of the packing circuitry is configured to select, in the respective demultiplexed bit-string, at least in said respective part, between the bits of each group based on the values of the bits in the group.

14. The circuit of claim 13, wherein N=3 and M=2;
wherein M of the input bit-strings each further comprise a second portion comprising one or more bits at more significant bit positions than the first portion, where $1 \leq M < N$ and if M >1 the second portions are the same fixed size as one another, such that the coordinates of the M input bit-strings have a larger maximum size being the size of the first portion plus the second portion, and the coordinates of the other N-M bit-strings have a smaller maximum size being the size of the first portion only;
wherein each of the packing circuitry is configured to select, in the respective demultiplexed bit-string, at least in said respective part, between the bits of each group based on the values of the bits in the group; and
wherein the bit packer in the 2-coordinate channel comprises circuitry configured to provide:
a first path arranged to pack down the bits that originate from the first portions of all three input bit-strings, the first path being arranged to select bit-by-bit between the two coordinates with the larger maximum size, and to select bit-by-bit between one of the coordinates with the larger maximum size and the coordinate with the smaller maximum size, the selections in the first path being based only on the values of the bits in the respective demultiplexed bit-string, and on an indication of whether or not an indicative one of the coordinates has the smallest size out of said set of coordinates, wherein the indicative coordinate is the coordinate whose bit is placed at the least or most significant bit position in each group in the grouped bit-stream; and
a second path arranged to pass through the bits that originate from the second portions of the two input bit-strings with the larger maximum size.

15. The circuit of claim 9, wherein the bit packer in the 1-coordinate channel comprises circuitry configured to provide:
a third path arranged to pack down the bits that originate from the first portions of all three input bit-strings, the third path being arranged to select bit-by-bit between all three coordinates; and
a fourth path arranged to pack down the bits that originate from the second portions of the two input bit-strings with the larger maximum size, the fourth path being arranged to select bit-by-bit between the two coordinates with the larger maximum size;
wherein the selection in both the third and fourth paths is based only on the values of the bits in the respective demultiplexed bit-string.

16. A processor comprising a GPU, and the circuit of claim 1.

17. The processor of claim 16, programmed to use the set of coordinates to represent a location of a texel within a texture, and to apply the texture to a virtual object in a graphics processing pipeline, said value comprising one or more of:
a colour of the texel,
a transparency of the texel,
a surface elevation of the texel, and/or
a surface normal at a point of the texel.

18. A non-transitory computer readable storage medium having stored thereon a computer readable dataset description of the circuit as set forth in claim 1 that, when processed in an integrated circuit manufacturing system, causes the integrated circuit manufacturing system to manufacture an integrated circuit embodying said circuit.

19. A method comprising:
receiving a set of N input bit-strings each comprising a respective coordinate of a set of N coordinates defining a point in N dimensions, where N≥2, each input bit-string comprising at least a first portion wherein the first portions are the same fixed number of bits in size as one another, wherein within each input bit-string each bit has a corresponding bit position from least to most significant within the bit-string, and wherein the circuit is capable of accommodating different size coordinates whereby in one or more of the input bit-strings the respective coordinate occupies only some of the bit positions with actual coordinate data representing the respective coordinate, the coordinate data being located in the least significant bit positions while any non-data bits not representing the respective coordinate are located in the most significant bit positions;

producing a grouped bit-string from the input bit-strings, in which the bits, including non-data bits, are grouped into groups of bits originating from the same bit position per group; and demultiplexing the grouped bit-string into n=1 ... N demultiplexed bit-strings and sending each to a respective n-coordinate channel, the nth demultiplexed bit-string comprising: a respective part of the grouped bit-string in which there are n coordinate data bits and N-n non-data bits per group, and all the other groups filled with null bits, unshifted relative to the respective part;

wherein each but the N-coordinate channel packs down the respective demultiplexed bit-string into a respective packed bit-string by removing the non-data bits from said respective part, and removing the same number of bits per group from the null bits; and wherein the method further comprises shifting the packed bit-strings to align them relative to one another according to the corresponding bit positions, and combining the shifted bit-strings, thereby producing a combined output bit-string.

20. A non-transitory computer readable storage medium having stored thereon computer readable code configured to cause the method of claim 19 to be performed when the code is run on at least one processor.

* * * * *